United States Patent
Kawase

(10) Patent No.: US 8,211,493 B2
(45) Date of Patent: Jul. 3, 2012

(54) DROPLET EJECTION APPARATUS, METHOD OF MANUFACTURING PANEL FROM BASE, IMAGE DISPLAY APPARATUS AND ELECTRONIC APPARATUS

(75) Inventor: Tomomi Kawase, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/178,914

(22) Filed: Jul. 8, 2011

(65) Prior Publication Data

US 2011/0261279 A1    Oct. 27, 2011

Related U.S. Application Data

(62) Division of application No. 11/229,691, filed on Sep. 20, 2005, now Pat. No. 8,001,923.

(30) Foreign Application Priority Data

Oct. 1, 2004  (JP) ................................. 2004-289904

(51) Int. Cl.
    *B05D 5/06* (2006.01)
(52) U.S. Cl. ............... 427/68; 427/66; 427/466; 427/64
(58) Field of Classification Search .................... 427/64, 427/68
    See application file for complete search history.

(56) References Cited

U.S. PATENT DOCUMENTS

| 2002/0081503 | A1 | 6/2002 | Kawase et al. |
| 2002/0105688 | A1 | 8/2002 | Katagami et al. |
| 2003/0001992 | A1 | 1/2003 | Kawase et al. |
| 2003/0011727 | A1 | 1/2003 | Kiguchi et al. |
| 2003/0076048 | A1* | 4/2003 | Rutherford ................ 315/169.3 |
| 2003/0113639 | A1 | 6/2003 | Kawase |
| 2003/0184613 | A1* | 10/2003 | Nakamura et al. .............. 347/40 |
| 2003/0186613 | A1 | 10/2003 | Kawase |
| 2004/0179061 | A1* | 9/2004 | Akahane ........................ 347/40 |

FOREIGN PATENT DOCUMENTS

| AT | 411975 B | 8/2004 |
| CN | 1448267 A | 10/2003 |

(Continued)

OTHER PUBLICATIONS

The Partial European Search Report dated Jun. 13, 2007 for the counterpart European Application No. 05021435.2.

(Continued)

*Primary Examiner* — Michael Cleveland
*Assistant Examiner* — Robert Vetere
(74) *Attorney, Agent, or Firm* — Global IP Counselors, LLP

(57) ABSTRACT

A method of manufacturing a panel from a base using a droplet ejection apparatus including two groups of heads with each group including first to fourth heads. In each group, the nozzle arrays of the first and third heads overlap throughout a first sub-area, the nozzle arrays of the first and fourth heads overlap throughout a second sub-area, and the nozzle arrays of the second and fourth heads overlap throughout a third sub-area when viewed from a second direction. The second sub-areas of the two groups partially overlap each other when viewed from the second direction. The method includes preparing the base, and supplying the liquid materials of the predetermined colors onto the base in the form of the droplets by ejecting the droplets by the droplet ejection apparatus while mutually moving the base and the head unit in the second direction.

7 Claims, 13 Drawing Sheets

FOREIGN PATENT DOCUMENTS

| | | | |
|---|---|---|---|
| EP | 123665 | A2 | 5/2002 |
| EP | 1225472 | A2 | 7/2002 |
| EP | 1228872 | A1 | 8/2002 |
| JP | 59-075205 | A | 4/1984 |
| JP | 04-099688 | A | 3/1992 |
| JP | 08-025635 | A | 1/1996 |
| JP | 2000-246951 | A | 9/2000 |
| JP | 2000-289233 | A | 10/2000 |
| JP | 2002-096462 | A | 4/2002 |
| JP | 2004-174985 | A | 6/2004 |
| JP | 2004-255335 | A | 9/2004 |

OTHER PUBLICATIONS

The Extended European Search Report dated Jun. 13, 2007 for the counterpart European Application No. 05021435.2.

* cited by examiner (a)

(b)

(a)

(b)

DROPLET EJECTION APPARATUS, METHOD OF MANUFACTURING PANEL FROM BASE, IMAGE DISPLAY APPARATUS AND ELECTRONIC APPARATUS

CROSS-REFERENCE TO RELATED APPLICATION

This application is a divisional application of U.S. patent application Ser. No. 11/229,691, now U.S. Pat. No. 8,001,923 filed on Sep. 20, 2005. This application claims priority to Japanese Patent Application No. 2004-289904 filed Oct. 1, 2004. The entire disclosures of U.S. patent application Ser. No. 11/229,691, now U.S. Pat. No. 8,001,923 and Japanese Patent Application No. 2004-289904 are hereby incorporated herein by reference.

FIELD OF THE INVENTION

The present invention relates to a droplet ejection apparatus, a method of manufacturing a panel from a base, an image display apparatus and an electronic apparatus.

BACKGROUND OF THE INVENTION

As a method of manufacturing a panel for an image display apparatus such as a color filter of a liquid crystal display, a method using a droplet ejection apparatus (ink jet drawing apparatus) is known (for example, see JP-A-59-75205). In this method, a plurality of pixels are formed on a substrate for manufacturing a panel on which a plurality of pixels (ejection regions) are formed by supplying a liquid material such as ink onto the plurality of pixels in the form of droplets using the droplet ejection apparatus. Such a droplet ejection apparatus for manufacturing a panel supplies the liquid material for forming pixels onto the plurality of pixels on the substrate by ejecting the liquid material in the form of droplets onto the substrate while mutually moving a stage for supporting the substrate with respect to a head unit on which a plurality of droplet ejection heads are provided.

A plurality of nozzles (nozzle openings) are formed in one droplet ejection head so as to be aligned, and the plurality of nozzles constitute a nozzle array. Since the length of the nozzle array is shorter than the size of the substrate, the plurality of droplet ejection heads are arranged on the head unit so that the nozzle arrays thereof connect each other when viewed from a scanning direction in order to make a width of a region on which droplets are ejected at one scanning operation of the head unit (a width to be drawn) longer.

However, since it is inevitable that some variations in the amount of ejection among the plurality of droplet ejection heads occur, for example, color of pixels onto which one droplet ejection head ejects droplets of the liquid material may become deep, and color of pixels onto which another droplet ejection head ejects droplets of the liquid material may become light. In such a case, there is a problem that color heterogeneity is generated in the panel.

Further, in the pixels in the vicinity of the seam between the nozzle array of one droplet ejection head and the nozzle array of the neighboring droplet ejection head to which the liquid material is supplied, there is a problem that a streak in which color heterogeneity extends along the scanning direction of the droplet ejection heads is generated in a panel due to difference between the amounts of ejection of both the droplet ejection heads or an error of nozzle pitches. In the case where the streak is generated in the panel, a display of an image display apparatus seems to include a streak when the image display apparatus is manufactured using such a panel. This makes image quality be diminished.

SUMMARY OF THE INVENTION

It is therefore an object of the present invention to provide a droplet ejection apparatus which can manufacture a high-quality panel that has no color heterogeneity, a method of manufacturing a panel from a base, an image display apparatus and an electronic apparatus provided with a panel that has no color heterogeneity.

In order to achieve the above object, in one aspect of the present invention, a method of manufacturing a panel from a base uses a droplet ejection apparatus for supplying some kinds of liquid materials each having a predetermined color. The apparatus includes: a head unit having at least first and second groups corresponding to the liquid materials of the predetermined color, respectively, wherein the first group includes a plurality of droplet ejection heads comprising at least a first droplet ejection head, a second droplet ejection head, a third droplet ejection head and a fourth droplet ejection head for ejecting the liquid material of the predetermined color, each of the first to fourth droplet ejection heads including at least one nozzle array constituted from a plurality of nozzles linearly aligned, the nozzle arrays of the first to fourth droplet ejection heads being parallel to each other in a first direction parallel to each of the nozzle arrays, wherein the second droplet ejection head is arranged between the third droplet ejection head and the fourth droplet ejection head when viewed from the first direction, and the third droplet ejection head is arranged between the first droplet ejection head and the second droplet ejection head when viewed from the first direction, wherein the second group includes a plurality of droplet ejection heads comprising at least a fifth droplet ejection head, a sixth droplet ejection head, a seventh droplet ejection head and an eighth droplet ejection head for ejecting the liquid material of the predetermined color, each of the fifth to eighth droplet ejection heads including at least one nozzle array constituted from a plurality of nozzles linearly aligned, the nozzle arrays of the fifth to eighth droplet ejection heads being parallel to each other in the first direction parallel to each of the nozzle arrays, wherein the sixth droplet ejection head is arranged between the seventh droplet ejection head and the eighth droplet ejection head when viewed from the first direction, and the seventh droplet ejection head is arranged between the fifth droplet ejection head and the sixth droplet ejection head when viewed from the first direction; a stage for supporting the base; a moving mechanism for moving the stage with respect to the head unit; and a control unit configured to control operation of the head unit and the moving mechanism so that the plurality of droplet ejection heads of the first group of the head unit eject droplets of the liquid material of the predetermined color onto the base, and the plurality of droplet ejection heads of the second group of the head unit eject droplets of the liquid material of the predetermined color onto the base while moving the stage with respect to the head unit in a second direction perpendicular to the first direction. An ejection area of the first group of the head unit in the first direction includes a first sub-area, a second sub-area, and a third sub-area with the second sub-area being continuously disposed between the first sub-area and the third sub-area without a gap, wherein an ejection area of the second group of the head unit in the first direction includes a fourth sub-area, a fifth sub-area, and a sixth sub-area with the fifth sub-area being continuously disposed between the fourth sub-area and the sixth sub-area without a gap. In the first group, the plurality of droplet ejection heads are arranged on the head unit so that the nozzle array of the first droplet ejection head overlaps the nozzle array of the third droplet ejection head throughout the first sub-area when viewed from the second direction, the nozzle array of the first droplet ejection head overlaps the nozzle array of the fourth droplet ejection head throughout the second sub-area when viewed from the second direction, and the nozzle array of the second droplet ejection head overlaps the nozzle array of the fourth droplet ejection head throughout the third sub-area when viewed from the second direction. In the second group, the plurality of droplet ejection heads are arranged on the head unit so that the nozzle array of the fifth droplet ejection head overlaps the nozzle array of the seventh droplet ejection head throughout the fourth sub-area when viewed from the second direction, the nozzle array of the fifth droplet ejection head overlaps the nozzle array of the eighth droplet ejection head throughout the fifth sub-area when viewed from the second direction, and the nozzle array of the sixth droplet ejection head overlaps the nozzle array of the eighth droplet ejection head throughout the sixth sub-area when viewed from the second direction. The second sub-area and the fifth sub-area partially overlap each other when viewed from the second direction. The fourth droplet ejection head and the fifth droplet ejection head are disposed next to each other when viewed from the first direction. The method includes: preparing the base; and supplying the some kinds of liquid materials of the predetermined color onto the base in the form of the droplets by ejecting the droplets by means of the droplet ejection apparatus while mutually moving the base with respect to the head unit in the second direction.

According to the droplet ejection apparatus of the present invention, it is possible to eject the droplets of the liquid material through the nozzles of the plurality of droplet ejection heads onto one ejection region (that is, one pixel) using an overlap of the nozzle arrays. Therefore, even in the case where there is a variation (error) among the amounts of ejection of the plurality of droplet ejection heads, it is possible to prevent harmful color heterogeneity from being generated in a surface of a panel to be manufactured from the base using the head unit of the present invention. In other words, in contrast to the present invention, in the case where a liquid material is supplied onto one ejection region through nozzles of only one droplet ejection head, variations of the amounts of ejection of the droplet ejection heads lead directly to a variation (error) of the amount of liquid material to be supplied onto each of the ejection regions, whereby color heterogeneity appears in the panel strongly. On the other hand, in the present invention, since the amount of liquid material to be supplied onto one ejection region becomes the average of the amounts of ejection of the plurality of droplet ejection heads overlapped in a scanning direction, it is possible to uniformize the amount of liquid material supplied onto each of the ejection regions, whereby it is possible to prevent the color heterogeneity from being generated.

Further, by supplying the droplets of the liquid material ejected through the nozzles of a different combination of two or more droplet ejection heads in the plurality of droplet ejection heads onto the ejection regions of each of the plurality of sub-areas on the base, it is possible to average (or balance) the amount of ejection of the liquid material with respect to each of the ejection regions as the whole of the base without biasing them. Therefore, it is possible to prevent harmful color heterogeneity from being generated in a surface of the panel to be manufactured more surely.

According to the method of manufacturing a panel from a base using the droplet ejection apparatus of the present invention, it is possible to eject the droplets of the liquid material through the nozzles of the plurality of droplet ejection heads onto one ejection region (that is, one pixel) using an overlap of the nozzle arrays. Therefore, even in the case where there is a variation (error) among the amounts of ejection of the plurality of droplet ejection heads, it is possible to prevent harmful color heterogeneity from being generated in a surface of a panel to be manufactured from the base using the head unit of the present invention. In other words, in contrast to the present invention, in the case where a liquid material is supplied onto one ejection region through nozzles of only one droplet ejection head, variations of the amounts of ejection of the droplet ejection heads lead directly to a variation (error) of the amount of liquid material to be supplied onto each of the ejection regions, whereby color heterogeneity appears in the panel strongly. On the other hand, in the present invention, since the amount of liquid material to be supplied onto one ejection region becomes the average of the amounts of ejection of the plurality of droplet ejection heads overlapped in a scanning direction, it is possible to uniformize the amount of liquid material supplied onto each of the ejection regions, whereby it is possible to prevent the color heterogeneity from being generated.

Further, by supplying the droplets of the liquid material ejected through the nozzles of a different combination of two or more droplet ejection heads in the plurality of droplet ejection heads onto the ejection regions of each of the plurality of sub-areas on the base, it is possible to average (or balance) the amount of ejection of the liquid material with respect to each of the ejection regions as the whole of the base without biasing them. Therefore, it is possible to prevent harmful color heterogeneity from being generated in a surface of the panel to be manufactured more surely.

In the method of manufacturing a panel from a base according to the present invention, it is preferable that the base is a base material for manufacturing a color filter substrate for a liquid-crystal display, and the one or more kind of liquid material is ink for forming a filter layer of the color filter substrate.

This makes it possible to manufacture the color filter substrate for a liquid-crystal display having no harmful color heterogeneity with high productivity (manufacturing efficiency).

In the method of manufacturing a panel from a base according to the present invention, it is preferable that the base is a base material for manufacturing an electroluminescence display, and the one or more kind of liquid material includes a luminescent material for manufacturing the electroluminescence display.

This makes it possible to manufacture an electroluminescence display having no harmful color heterogeneity with high productivity (manufacturing efficiency).

In yet another aspect of the present invention, the present invention is directed to an image display apparatus including the panel manufactured using the method described above.

This makes it possible to manufacture the image display apparatus having no harmful color heterogeneity with high productivity (manufacturing efficiency).

In still another aspect of the present invention, the present invention is directed to an electronic apparatus including the image display apparatus described above.

This makes it possible to manufacture the electronic apparatus including the image display apparatus having no harmful color heterogeneity with high productivity (manufacturing efficiency).

In the droplet ejection apparatus of the present invention, it is preferable that the combination of the two or more droplet ejection heads for ejecting the liquid material in the form of droplets onto the ejection regions of one sub-area of the base is different from the combination of the two or more droplet ejection heads for ejecting the liquid material in the form of droplets onto the ejection regions of the adjacent sub-area of the base, while these combinations of the two or more droplet ejection heads use at least one common droplet ejection head.

Thus, since an error of the amount of ejection of the liquid material at the boundary of the adjacent sub-areas on the base is made to become smaller, it is possible to prevent a streak from becoming conspicuous at the boundary of each of the adjacent sub-areas more surely.

In the droplet ejection apparatus of the present invention, it is preferable that the plurality of droplet ejection heads include plural sets of droplet ejection heads from which some kinds of liquid materials of different colors are to be ejected so that the plurality of sub-areas are formed on the base for each of the plural sets of the droplet ejection heads, and wherein a position of a boundary of the adjacent sub-areas in the sub-areas for the liquid material of one color is different from a position of a boundary of the adjacent sub-areas in the sub-areas for the liquid material of other color.

Thus, even in the case where a streak is generated at the boundary of each of the adjacent sub-areas on the base, it is possible to make the streak become inconspicuous because the streaks generated on the ejection regions of each color do not overlap with respect to each other but are dispersed at different positions on the panel to be manufactured.

In the droplet ejection apparatus of the present invention, it is preferable that the some kinds of liquid materials include three kinds of liquid materials which respectively have red, green and blue colors.

In the droplet ejection apparatus of the present invention, it is preferable that the base is a base material for manufacturing a color filter substrate for a liquid-crystal display, and the one or more kind of liquid material is ink for forming a filter layer of the color filter substrate.

This makes it possible to manufacture the color filter substrate for a liquid-crystal display having no harmful color heterogeneity and streak with high productivity (manufacturing efficiency).

In the droplet ejection apparatus of the present invention, it is preferable that the base is a base material for manufacturing an electroluminescence display, and the one or more kind of liquid material includes a luminescent material for manufacturing the electroluminescence display.

This makes it possible to manufacture an electroluminescence display having no harmful color heterogeneity and streak with high productivity (manufacturing efficiency).

BRIEF DESCRIPTION OF THE DRAWINGS

The foregoing and other objects, features and advantages of the present invention will become more readily apparent from the following detailed description of preferred embodiment of the present invention which proceeds with reference to the accompanying drawings.

DETAILED DESCRIPTION OF THE INVENTION

Preferred embodiment of a droplet ejection apparatus, a method of manufacturing a panel from a base, an image display apparatus and an electronic apparatus according to the present invention will now be described in detail with reference to the appending drawings.

In the present embodiment, the case of manufacturing a color filter substrate 10 that is to become a component of a liquid crystal display as one example of a panel will be described typically.

(Entire Configuration of Droplet Ejection Apparatus)

Figure 1:
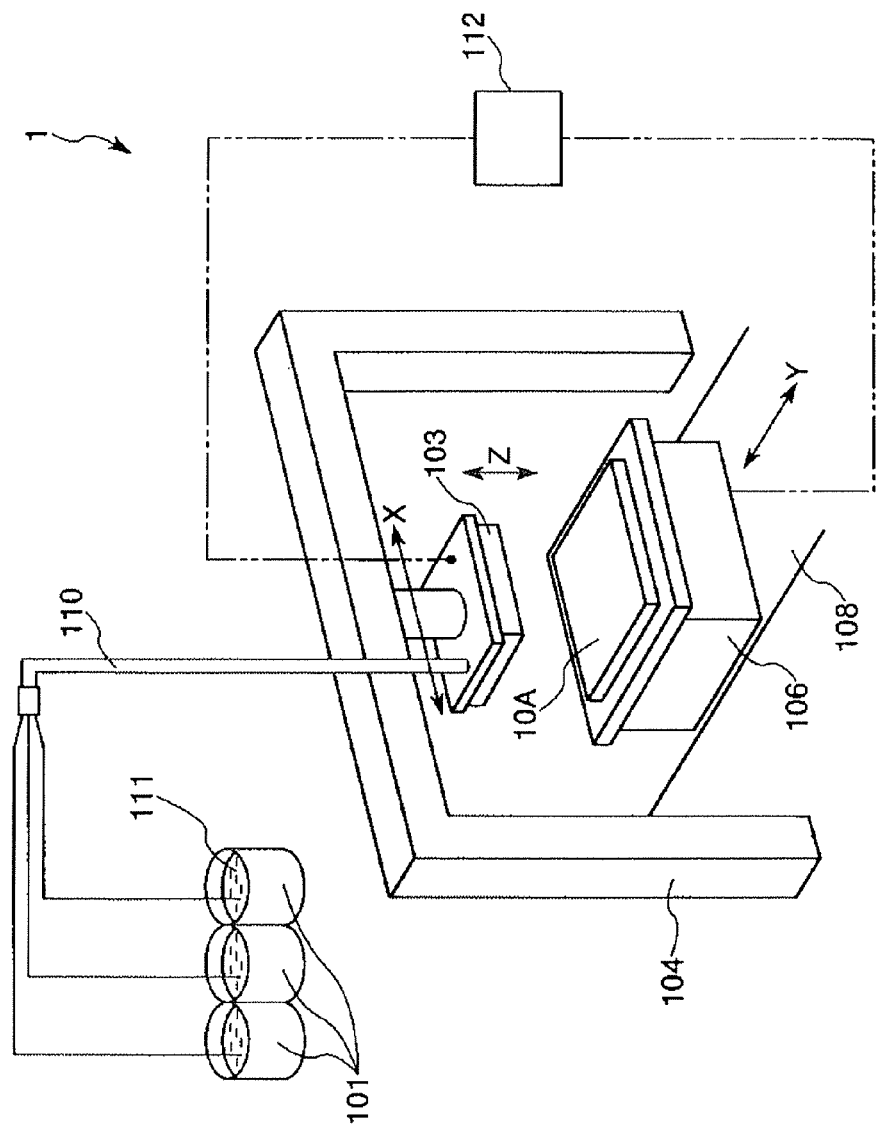
FIG. 1 is a perspective view of a droplet ejection apparatus in an embodiment of the present invention.

FIG. 1 is a perspective view of a droplet ejection apparatus 1 in an embodiment of the present invention. As shown in FIG. 1, the droplet ejection apparatus 1 is provided with a head unit 103 in which a plurality of droplet ejection heads 2 are mounted on a carriage 105; a carriage moving mechanism (moving mechanism) 104 for moving the head unit 103 in one horizontal direction (hereinafter, referred to as an "X axis direction"); a stage 106 for supporting a base 10A described later; a stage moving mechanism (moving mechanism) 108 for moving the stage 106 in a horizontal direction perpendicular to the X axis direction (hereinafter, referred to as a "Y axis direction"); and a control unit 112 for controlling the head unit 103, the carriage moving mechanism 104 and the stage moving mechanism 108.

Further, three tanks 101 are provided for respectively storing three kinds of liquid materials 111 including red (R), green (G) and blue (B) in the vicinity of the droplet ejection apparatus 1. Each of the tanks 101 is connected to the head unit 103 via a tube 110 functioning as a flow path for sending the liquid materials 111. The liquid material 111 stored in each of the tanks 101 is sent (supplied) to each of the droplet ejection heads 2 in the head unit 103.

In this regard, the "liquid material" in the present invention includes a material used for forming pixels of a panel, and means a material having enough degree of viscosity to be ejected through the nozzle 25 of the droplet ejection head 2. In this case, the material may be either water-based or oil-based. Further, the material needs only have ejectable fluidity (degree of viscosity) through the nozzle 25 of the droplet ejection head 2. Even though a solid material may be dispersed into the material, the material may be fluid as a whole. The liquid materials 111 in the present embodiment are organic solvent inks in which pigments for forming a filter layer of pixels of a color filter substrate 10 are dissolved or dispersed in an organic solvent.

In this regard, in the following description, in the case of distinguishing the liquid materials 111 of red, green and blue, they are respectively referred to as the "liquid materials 111R, 111G and 111B". On the other hand, in the case of generally naming them without distinguishing the colors, each of them is referred to simply as the "liquid material 111".

The operation of the carriage moving mechanism 104 is controlled by the control unit 112. The carriage moving mechanism 104 in the present embodiment has a function of adjusting the height of the head unit 103 by moving the head unit 103 along a vertical direction (hereinafter, referred to as a "Z axis direction"). Further, the carriage moving mechanism 104 also has a function of rotating the head unit 103 around an axis parallel to the Z axis direction, and this makes it possible to fine adjust the angle of the head unit 103 around the Z axis.

The stage 106 has a plane parallel to both the X axis direction and the Y axis direction. Further, the stage 106 is constructed so that the base 10A used for manufacturing a color filter substrate 10 can be fixed or held (or supported) thereon. The stage moving mechanism 108 moves the stage 106 along the Y axis direction perpendicular to both the X axis direction and the Z axis direction. The operation of the stage moving mechanism 108 is controlled by the control unit 112. Further, the stage moving mechanism 108 in the present embodiment also has a function of rotating the stage 106 around an axis parallel to the Z axis direction, and this makes it possible to correct the position of the base 10A by fine adjusting the slant of the base 10A mounted on the stage 106 around the Z axis direction so that the base 10A becomes straight with respect to the head unit 103.

As described above, the head unit 103 is moved to the X axis direction by means of the carriage moving mechanism 104. On the other hand, the stage 106 is moved to the Y axis direction by means of the stage moving mechanism 108. Therefore, a mutual position of the head unit 103 with respect to the stage 106 can be changed by the carriage moving mechanism 104 and the stage moving mechanism 108.

In this regard, the detailed construction and function of the control unit 112 will be described later.

(Head Unit)

Figure 2:
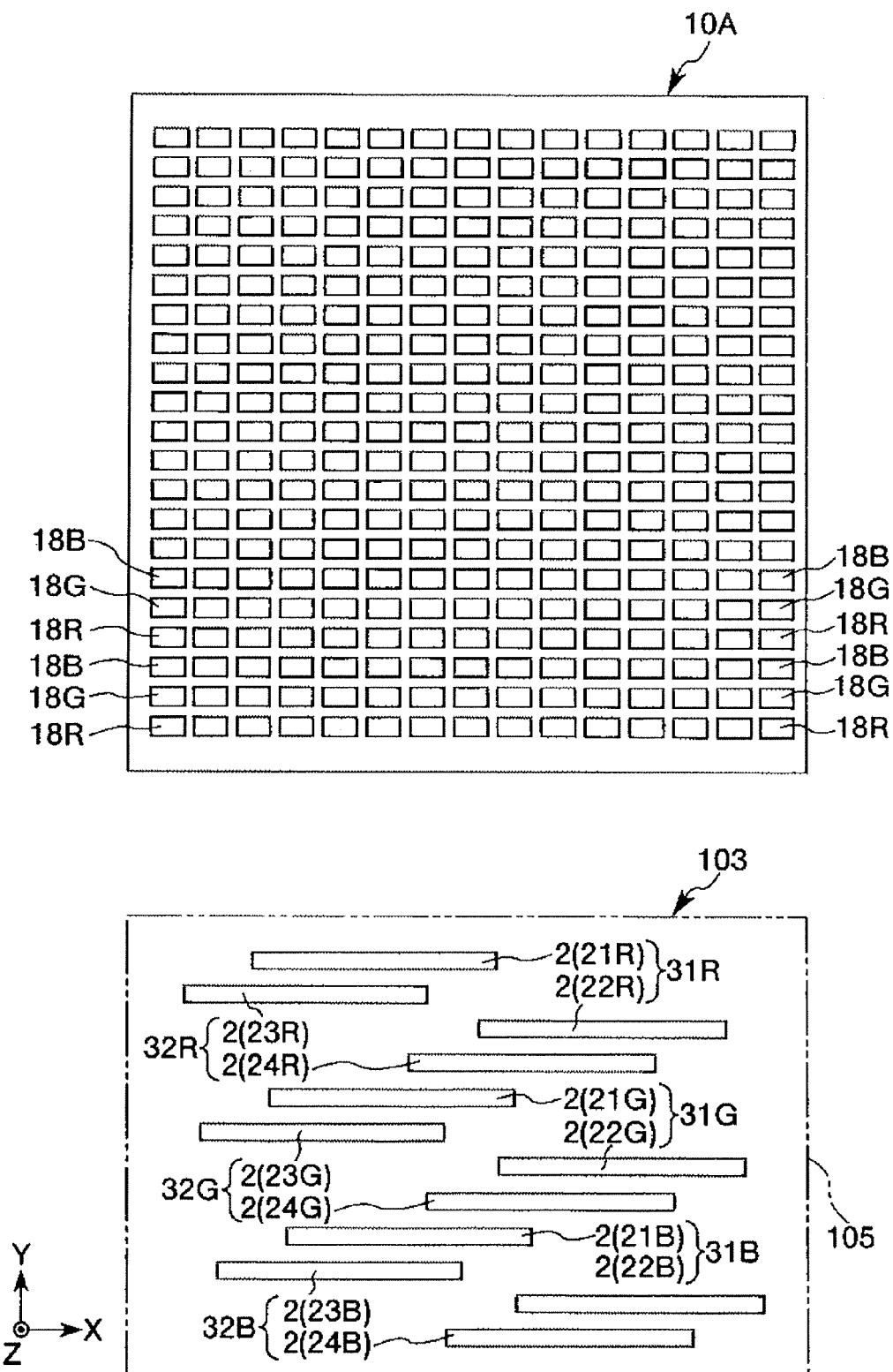
FIG. 2 is a plan view which shows a head unit of the droplet ejection apparatus shown in FIG. 1 and a base.

FIG. 2 is a plan view which shows the head unit 103 of the droplet ejection apparatus 1 shown in FIG. 1 and the base 10A. The head unit 103 shown in FIG. 2 has a structure in which the plurality of droplet ejection heads 2 are mounted on the carriage 105. The carriage 105 is shown in FIG. 2 with a chain double-dashed line. Further, solid lines which respectively show the plurality of droplet ejection heads 2 indicate the positions of nozzle surfaces (that is, nozzle plates 128 described later) of the plurality of droplet ejection heads 2.

Four droplet ejection heads 2 for ejecting the liquid material 111R of red, four droplet ejection heads 2 for ejecting the liquid material 111G of green and four droplet ejection heads 2 for ejecting the liquid material 111B of blue are provided on the head unit 103. The four droplet ejection heads 2 for ejecting the liquid material 111R of red include a first droplet ejection head 21R, a second droplet ejection head 22R, a third droplet ejection head 23R and droplet ejection head 24R. The four droplet ejection heads 2 for ejecting the liquid material 111G of green include a first droplet ejection head 21G, a second droplet ejection head 22G, a third droplet ejection head 23G and droplet ejection head 24G. The four droplet ejection heads 2 for ejecting the liquid material 111B of blue include a first droplet ejection head 21B, a second droplet ejection head 22B, a third droplet ejection head 23B and droplet ejection head 24B.

In the following description, in the case of generally naming these droplet ejection heads 2 without distinguishing them by the colors of the liquid materials to be ejected, each of them is referred to simply as the "droplet ejection head 2". On the other hand, in the case of distinguishing the droplet ejection heads 2 for ejecting the liquid materials 111 of red, green and blue, they are referred to as, for example, "the first droplet ejection head 21R, the second droplet ejection head 22R, ...".

The base 10A shown in FIG. 2 is a base material for manufacturing a color filter substrate 10 for a liquid-crystal display on which color filters are arranged in a stripe manner. A plurality of red pixels (ejection regions) 18R, a plurality of green pixels (ejection regions) 18G and a plurality of blue pixels (ejection regions) 18B are provided on the base 10A. The droplet ejection apparatus 1 operates so that the liquid material 111R of red is supplied onto each of the pixels 18R, the liquid material 111G of green is supplied onto each of the pixels 18G, and the liquid material 111B of blue is supplied onto each of the pixels 18B.

Each of the pixels 18R, 18G and 18B has a substantially rectangular shape. The base 10A is supported on the stage 106 with the posture in which the long axis direction of each of the pixels 18R, 18G and 18B is parallel to the X axis direction and the short axis direction of each of the pixels 18R, 18G and 18B is parallel to the Y axis direction. The plurality of pixels 18R, 18G and 18B are arranged on the base 10A so as to be repeatedly arranged in this order along the Y axis direction, and so that the pixels of the same color are arranged along the X axis direction. A set of pixels 18R, 18G and 18B arranged in the Y axis direction correspond to one picture element of the color filter substrate 10 to be manufactured.

(Droplet Ejection Head)

Figure 3:
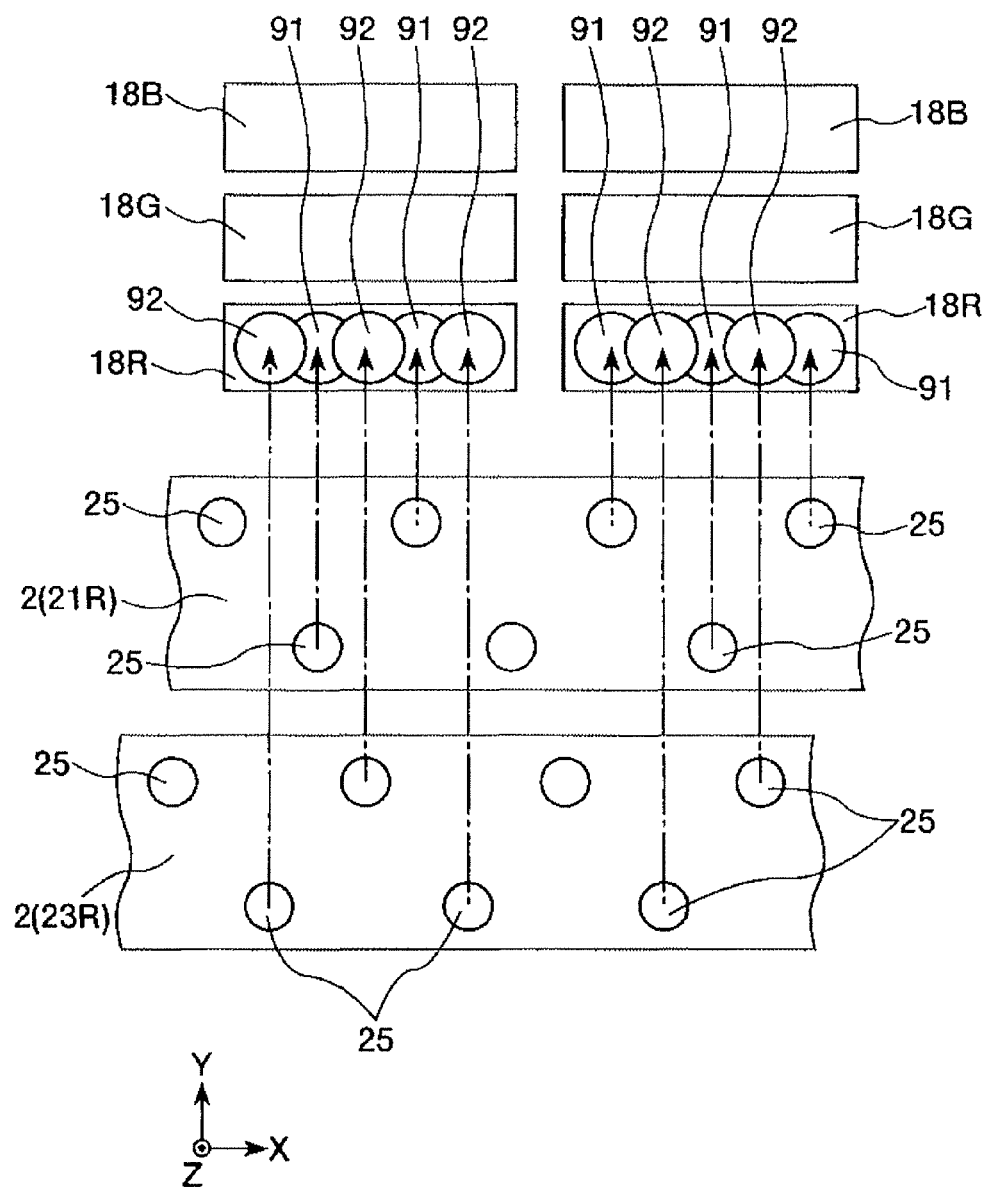
FIG. 3 is an enlarged plan view which shows a part of a nozzle surface (nozzle plate) of the droplet ejection heads and pixels of the base.

FIG. 3 is an enlarged plan view which shows a part of a nozzle surface (nozzle plate 128) of the droplet ejection heads 2 and the pixels of the base 10A. In this regard, although the nozzle surface of each of the droplet ejection heads 2 is provided so as to face the base 10A, that is, in a vertical direction, for facilitation of visualization, FIG. 3 shows the nozzle surface of each of the droplet ejection heads 2 with a solid line. A plurality of nozzles (nozzle holes) 25 are formed on the nozzle surface of each of the droplet ejection heads 2 so as to be linearly aligned along the X axis direction at even intervals. The plurality of nozzles 25 in each of the droplet ejection heads 2 constitute at least one nozzle array. In the present embodiment, two nozzle arrays are formed on each of the droplet ejection heads 2 in a parallel manner so as to be shifted with a half pitch with respect to each other. However, the present invention is not limited thereto. The number of nozzle arrays that one droplet ejection head 2 has may be one, or three or more. Further, the number of nozzles 25 that are formed on one droplet ejection head 2 is not particularly limited, and it may normally be in the range of about several dozens to several hundreds.

FIGS. 4(a) and 4(b) are respectively a perspective cross-sectional view and a cross sectional view of the droplet ejection head 2 of the droplet ejection apparatus 1 shown in FIG. 1. As shown in FIGS. 4(a) and 4(b), each of the droplet ejection heads 2 constitutes an ink jet head. More specifically, the droplet ejection head 2 is provided with a diaphragm plate 126 and a nozzle plate 128. A reservoir 129 is positioned between the diaphragm plate 126 and the nozzle plate 128. The reservoir 129 fulfills with the liquid material 111 supplied from the tank 101 via an ink intake port 131.

A plurality of dividing walls 122 are positioned between the diaphragm plate 126 and the nozzle plate 128. A cavity 120 is defined by the diaphragm plate 126, the nozzle plate 128 and a pair of dividing walls 122. Since the cavity 120 is provided in accordance with one nozzle 25, the number of cavities 120 is the same as the number of nozzles 25. The liquid material 111 is supplied to the cavity 120 via an ink supply port 130 provided between the pair of dividing walls 122.

A vibrator 124 as a driving element is positioned on the diaphragm plate 126 in accordance with each of the cavities 120. The vibrator 124 changes liquid pressure of the liquid material 111 fulfilled within the cavity 120, and includes a piezoelectric element 124C, and a pair of electrodes 124A and 124B between which the piezoelectric element 124C is sandwiched. By applying a driving voltage signal between the pair of electrodes 124A and 124B, the piezoelectric element 124C deforms to change the liquid pressure of the liquid material 111 fulfilled within the cavity 120, thereby ejecting the liquid material 111 in the form of droplets through the corresponding nozzle 25. The shape of each of the nozzles 25 is adjusted so that the liquid material 111 is ejected in the Z axis direction through each nozzle 25.

The control unit 112 shown in FIG. 1 may be constructed to apply a driving voltage signal to each of the plurality of vibrators 124 independently from each other. In other words, a volume of the liquid material 111 to be ejected through each of the nozzles 25 may be controlled in accordance with the driving voltage signal from the control unit 112 with reference to each nozzle 25.

Figure 4:
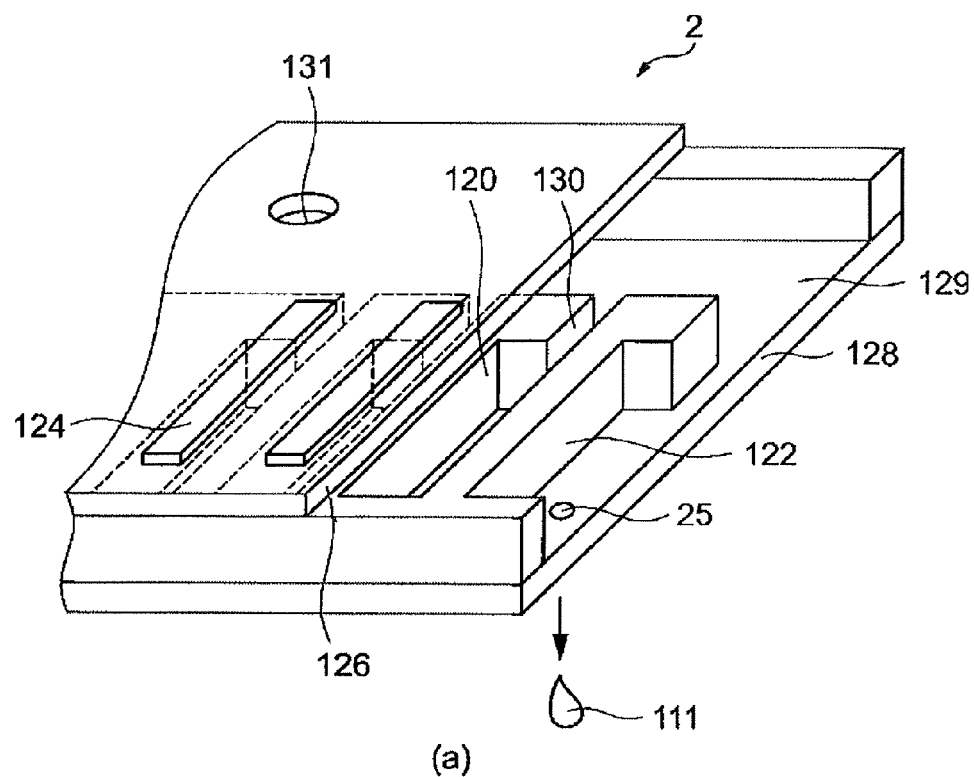
FIGS. 4(a) and 4(b) are respectively a perspective cross-sectional view and across sectional view of the droplet ejection head of the droplet ejection apparatus shown in FIG. 1.
Figure 4:
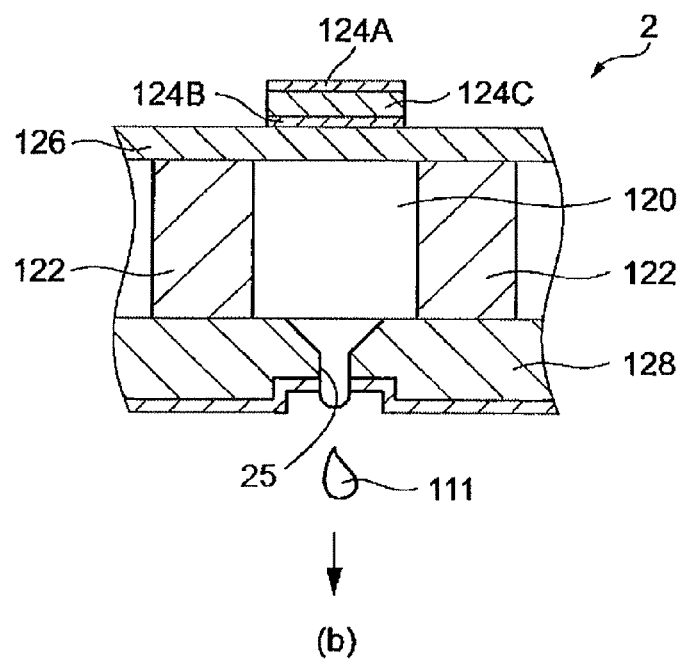

In this regard, the droplet ejection head 2 is not limited to one which uses a piezoelectric actuator as shown in FIG. 4 as a driving element. For example, the droplet ejection head 2 may use an electrostatic actuator, or may have a structure in which the liquid material 111 is ejected in the form of droplets using thermal expansion of the liquid material 111 (film boiling) by means of an electro-thermal converting element.

(Control Unit)

Figure 5:
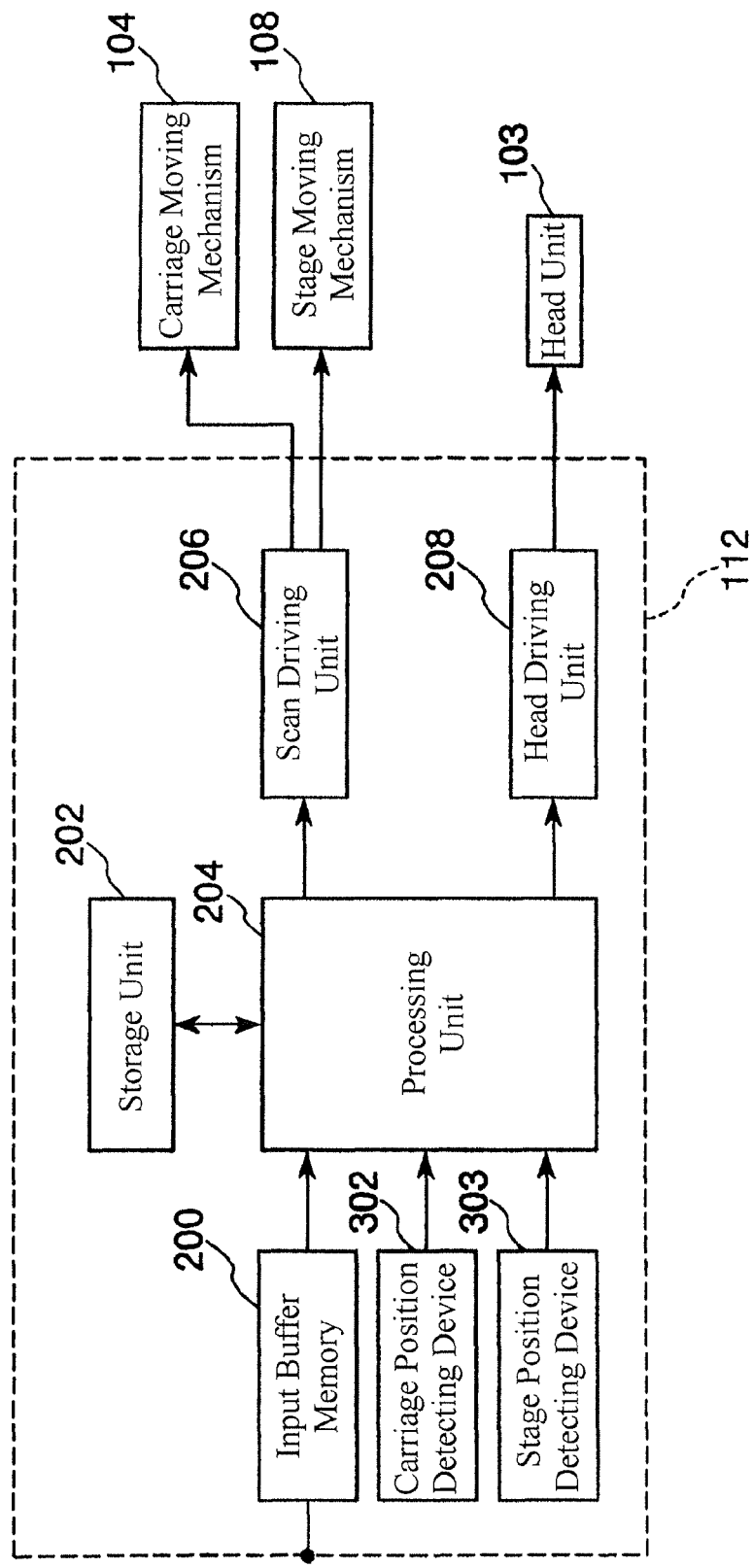
FIG. 5 is a block diagram of the droplet ejection apparatus shown in FIG. 1.

Next, the configuration of the control unit 112 will be now described. FIG. 5 is a block diagram of the droplet ejection apparatus 1 shown in FIG. 1 which includes the control unit 112. As shown in FIG. 5, the control unit 112 is provided with an input buffer memory 200, a storage unit 202, a processing unit 204, a scan driving unit 206, a head driving unit 208, a carriage position detecting device 302, and a stage position detecting device 303.

The processing unit 204 is electrically connected to each of the input buffer memory 200, the storage unit 202, the scan driving unit 206, the head driving unit 208, the carriage position detecting device 302 and the stage position detecting device 303. Further, the scan driving unit 206 is electrically connected to both the carriage moving mechanism 104 and the stage moving mechanism 108. Similarly, the head driving unit 208 is electrically connected to each of the plurality of droplet ejection heads 2 in the head unit 103.

The input buffer memory 200 receives data on positions to be ejected for droplets of the liquid material 111, that is, drawing pattern data from an outer information processing apparatus. The input buffer memory 200 outputs the drawing pattern data to the processing unit 204, and the processing unit 204 then stores the drawing pattern data in the storage unit 202. In this regard, the storage unit 202 shown in FIG. 5 is constituted from a RAM (Random Access Memory), magnetic recording media, magneto-optic recording media or the like.

The carriage position detecting device 302 detects the position of the carriage 105, that is, the head unit 103 in the X axis direction (moving distance of the carriage 105 in the X axis direction), and outputs the detected signal into the processing unit 204. The carriage position detecting device 302 and the stage position detecting device 303 are constituted from a linear encoder, a laser length measuring device or the like, for example.

The processing unit 204 controls the operation of the carriage moving mechanism 104 and the stage moving mechanism 108 via the scan driving unit 206 on the basis of the detected signals of both the carriage position detecting device 302 and the stage position detecting device 303, thereby controlling the position of the head unit 103 and the position of the base 10A. Further, the processing unit 204 controls the moving velocity of the stage 106, that is, the base 10A by controlling the operation of the stage moving mechanism 108.

Moreover, the processing unit 204 outputs a selection signal SC for specifying ON/OFF of each of the nozzles 25 in each ejection timing to the head driving unit 208 on the basis of the drawing pattern data stored in the storage unit 202. The head driving unit 208 then outputs an ejection signal required to eject the liquid material 111 to each of the droplet ejection heads 2 on the basis of the selection signal SC. As a result, the liquid material 111 is ejected in the form of droplets through the corresponding nozzles 25 in each of the droplet ejection heads 2.

The control unit 112 may be a computer provided with a CPU (central processing unit), a ROM (read only memory), a RAM and the like. In this case, the operation of the control unit 112 described above may be realized using software program that the computer can carry out. Alternatively, the control unit 112 may be realized with a dedicated circuit (that is, using hardware).

Figure 6:
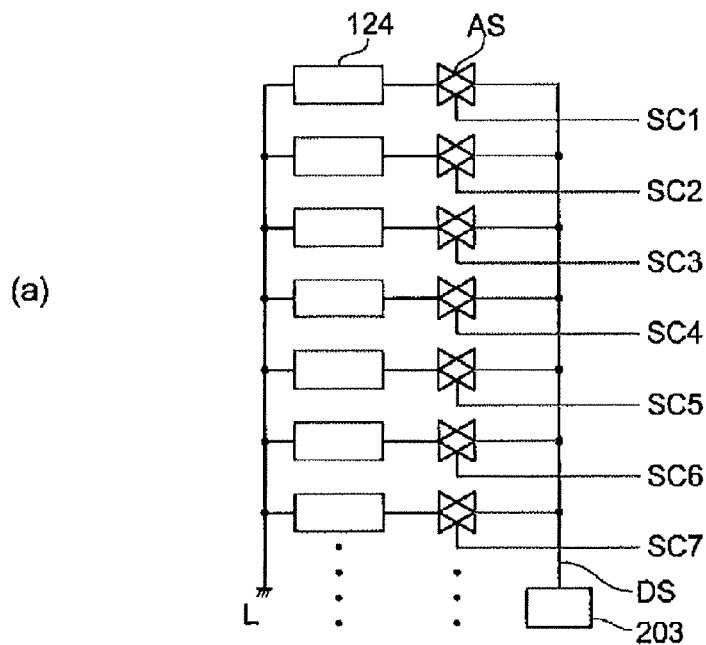
FIG. 6(a) is a schematic view of a head driving unit.
FIG. 6(b) is a timing chart which shows a driving signal, a selecting signal and an ejection signal for the head driving unit.
Figure 6:
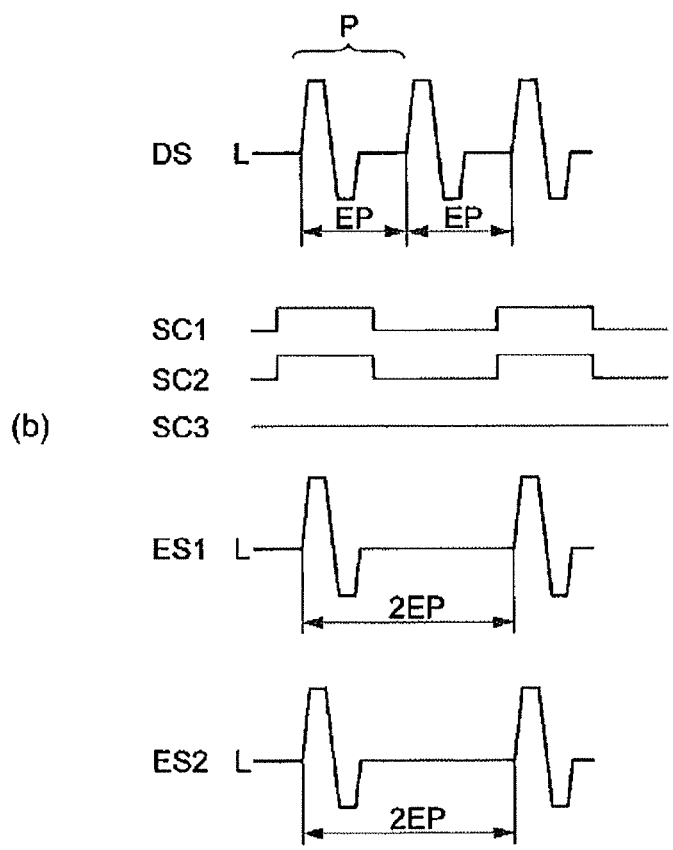

Next, the configuration and function of the head driving unit 208 in the control unit 112 will be described. FIG. 6(a) is a schematic view of the head driving unit 208. FIG. 6(b) is a timing chart which shows a driving signal, a selecting signal and an ejection signal for the head driving unit 208. As shown in FIG. 6(a), the head driving unit 208 includes one driving signal generator 203, and a plurality of analog switches AS. As shown in FIG. 6(b), the driving signal generator 203 generates a driving signal DS. Potential of the driving signal DS is temporally changed with respect to a reference potential L. More specifically, the driving signal DS includes a plurality of ejection waveforms P that repeat with the ejection cycle EP. In this regard, the ejection waveform P corresponds to a driving voltage waveform to be applied between the pair of electrodes 124A and 124B in the corresponding vibrator 124 in order to eject one droplet through one nozzle 25.

The driving signal DS is supplied to an input terminal of each of the analog switches AS. Each of the analog switches AS is provided in accordance with each of the nozzles 25. Namely, the number of analog switches AS is the same as the number of nozzles 25.

The processing unit 204 outputs the selection signal SC for indicating ON/OFF of each of the nozzles 25 to each of the analog switches AS. In this regard, the selection signal SC can become either a high level state or a low level state with respect to each of the analog switches AS. In response to the driving signal DS and the selection signal SC, each of the analog switches AS applies an ejection signal ES to the electrode 124A of the corresponding vibrator 124. More specifically, in the case where the selection signal SC becomes the high level state, the corresponding analog switch AS is turned ON, and applies the driving signal DS as the ejection signal ES to the corresponding electrode 124A. On the other hand, in the case where the selection signal SC becomes the low level state, the corresponding analog switch AS is turned OFF, and the potential of the ejection signal ES that the corresponding analog switch AS outputs to the corresponding electrode 124A becomes a reference potential L. When the driving signal DS is applied to the electrode 124A of the vibrator 124, the liquid material 111 is ejected through the nozzle 25 that corresponds to the vibrator 124. In this regard, the reference potential L is applied to the electrode 124B of each of the vibrators 124.

In an example shown in FIG. 6(b), a high level period and a low level period of each of two selection signals SC are set so that the ejection waveform P appears with a cycle 2EP that is twice the ejection cycle EP in each of two ejection signals ES. Thus, the liquid material 111 is ejected in the form of droplets through each of the two corresponding nozzles 25 with the cycle 2EP. A common driving signal DS is applied to each of the vibrators 124 that correspond to the two nozzles 25 from a shared driving signal generator 203. For this reason, the liquid material 111 is ejected through the two nozzles 25 at substantially same timing.

Such a droplet ejection apparatus 1 operates so that droplets of the liquid materials 111 are ejected through the nozzles 25 of each of the droplet ejection heads 2 in the head unit 103 and supplied (landed) onto each of the pixels 18R, 18G and 18B on the base 10A while moving the base 10A supported on the stage 106 in the Y axis direction by the operation of the stage moving mechanism 108, and passing the base 10A under the head unit 103. Hereinafter, this operation of the droplet ejection apparatus 1 may be referred to as "main scanning movement between the head unit 103 and the base 10A".

In the case where the width of the base 10A in the X axis direction is smaller than the length of the entire head unit 103 in the X axis direction (that is, an entire ejection width W described later) to which the liquid materials 111 can be ejected with respect to the base 10A, it is possible to supply the liquid materials 111 onto the whole of the base 10A by carrying out the main scanning movement between the head unit 103 and the base 10A once. On the other hand, in the case where the width of the base 10A in the X axis direction is larger than the entire ejection width W of the head unit 103, it is possible to supply the liquid materials 111 onto the whole of the base 10A by repeatedly alternating the main scanning movement between the head unit 103 and the base 10A and the movement of the head unit 103 in the X axis direction by means of the operation of the carriage moving mechanism 104 (referred to as a "sub-scanning movement").

Figure 7:
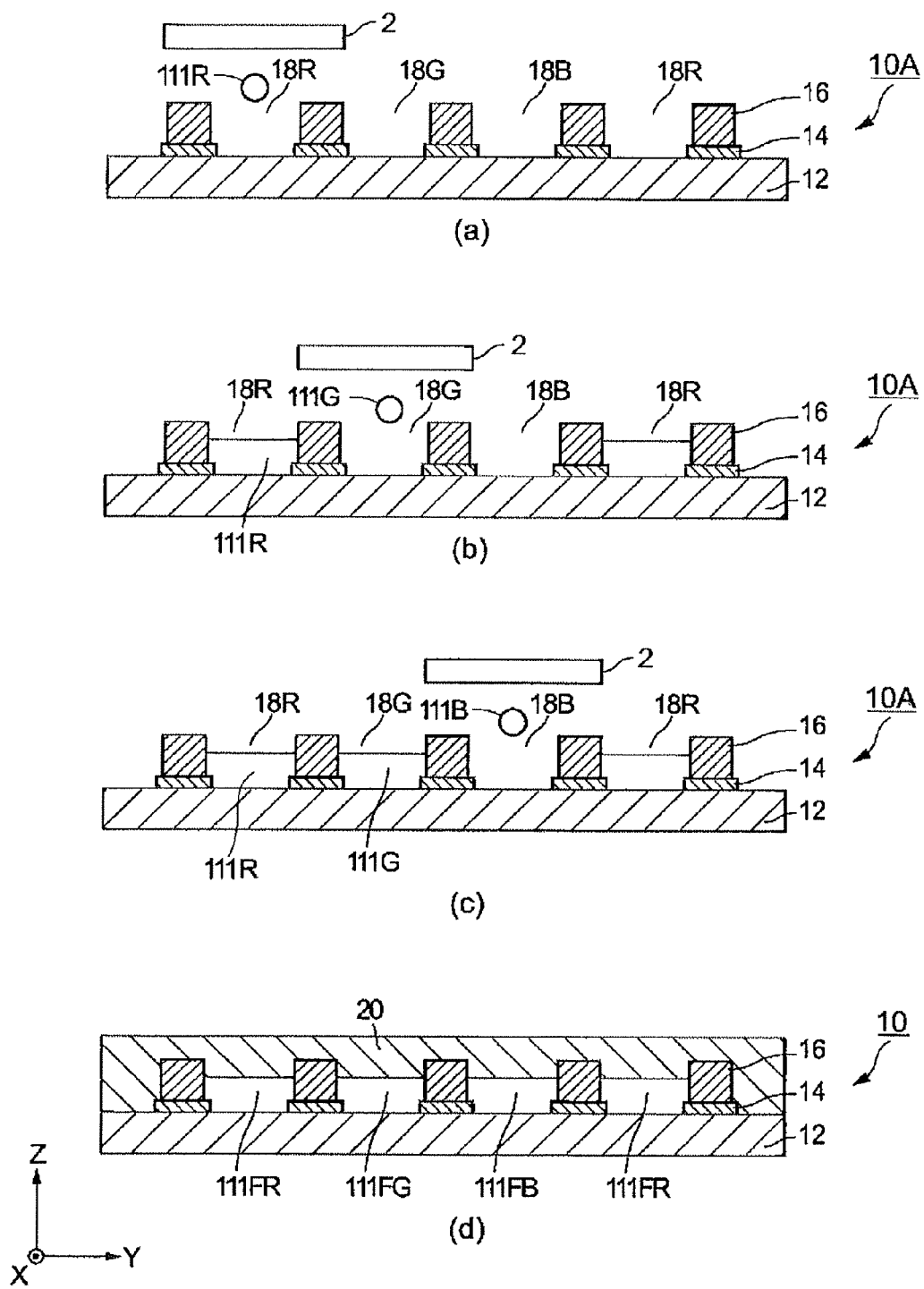
FIG. 7 is a schematic cross-sectional view which shows a method of manufacturing a color filter substrate.

Next, a method of manufacturing the color filter substrate 10 using the droplet ejection apparatus 1 described above will now be described in detail. FIG. 7 is a schematic cross-sectional view which shows a method of manufacturing a color filter substrate 10. As shown in FIG. 7, the base 10A includes a supporting substrate 12 having light permeability, and a plurality of pixels 18R, 18G and 18B each becoming a color element (pixel region) formed on the supporting substrate 12 so as to be separated with black matrices 14 and banks 16. The black matrices 14 are formed from a material having light shielding effect. The black matrices 14 and the banks 16 provided on the black matrices 14 are positioned on the supporting substrate 12 so that a plurality of light permeating portions, that is, a plurality of pixel 18R, 18G and 18B are defined by them in a matrix manner. Namely, the plurality of pixels 18R, 18G and 1(B are formed as partitions by the supporting substrate 12, the black matrices 14 and the banks 16. The pixel 18R is a region in which a filter layer 111FR into which only light having any wavelength within a red wavelength region permeates is to be formed. The pixel 18G is a region in which a filter layer 111FG into which only light having any wavelength within a green wavelength region permeates is to be formed. The pixel 18B is a region in which a filter layer 111FB into which only light having any wavelength within a blue wavelength region permeates is to be formed.

A base 10A is manufactured in accordance with the following steps when manufacturing a color filter substrate 10. First, a metallic thin film is formed on a supporting substrate 12 by means of a spattering method or an evaporation method. Black matrices 14 are then formed in a reticular pattern from the metallic thin film by means of a photolithography method. Metal chromium and chromium oxide may be mentioned as materials for the black matrices 14. In this regard, the supporting substrate 12 is a substrate having light permeability with respect to visible light (optical wavelength), such as a glass substrate. Subsequently, a resist layer constituted from negative type photopolymer composition is applied so as to cover the supporting substrate 12 and the black matrices 14. The resist layer is exposed while making a mask film formed in a matrix pattern stick on the resist layer. Then, banks 16 are obtained by removing the non-exposed portions of the resist layer by means of an etching process. In this way, the base 10A is obtained.

In this regard, banks formed from a resin black may be utilized in place of the banks 16. In this case, no metallic thin film (that is, black matrices 14) is required, and the bank layer is constructed from one layer.

Next, the base 10A is made to become lyophilic by means of an oxygen plasma process under atmospheric pressure. The surface of the supporting substrate 12, the surface of the black matrices 14, and the surface of the banks 16 in the concave portions (a part of the pixel), each of which is defined by the supporting substrate 12, the black matrices 14 and the banks 16, tend to take on lyophilic by this process. Further, a plasma process using $CF_4$ as a process gas is then carried out to the base 10A. By the plasma process using $CF_4$, the surface of the banks 16 in each of the concave portions is fluorinated, and the surface of the banks 16 tends to take on non-lyophilic by this process. In this regard, by the plasma process using $CF_4$, the surface of the supporting substrate 12 and the surface of the black matrices 14 that have taken on lyophilic lose lyophilic slightly. However, even so, these surfaces can maintain lyophilic. In this regard, in accordance with the material of the supporting substrate 12, the material of the black matrices 14, and the material of the banks 16, the surface of each of the concave portions may take on desired lyophilic and non-lyophilic without the surface treatment described above. In such a case, it is no need for the surface to be subjected to the surface treatment described above.

The base 10A on which the pixels 18R, 18G and 18B were formed as described above is transported onto the stage 106 of the droplet ejection apparatus 1, and supported on the stage 106. The droplet ejection apparatus 1 moves the base 10A in the Y axis direction by operating the stage moving mechanism 108, and supplies the liquid materials in the form of droplets onto each of the pixels 18R, 18G and 18B from each of the droplet ejection heads 2 while passing the base 10A under the head unit 103. At this time, as shown in FIGS. 7(a) to 7(c), the red liquid material 111R (color filter material) is ejected onto each of the pixels 18R, the green liquid material 111G (color filter material) is ejected onto each of the pixels 18G, and the blue liquid material 111B (color filter material) is ejected onto each of the pixels 18B.

After respectively supplying the liquid materials 111R, 111G and 111B onto each of the pixels 18R, 18G and 18B, the base 10A is transported into a drying apparatus (not shown in the drawings) to dry the liquid materials 111R, 111G and 111B respectively supplied into each of the pixels 18R, 18G and 18B. Thus, filter layers 111FR, 111FG and 111FB are formed on each of the pixels 18R, 18G and 18B, respectively. In this regard, by repeatedly carrying out the supply of the liquid materials 111R, 111G and 111B using the droplet ejection apparatus 1 and the drying the supplied liquid materials 111R, 111G and 111B by means of the drying apparatus to laminate the liquid materials 111R, 111G and 111B and the filter layers 111FR, 111FG and 111FB alternately, final filter layers 111FR, 111FG and 111FB may be formed on each of the pixels 18R, 18G and 18B.

The base 10A is then transported into an oven (not shown in the drawings) and the filter layers 111FR, 111FG and 111FB are post-baked (that is, reheated) in this oven.

Next, the base 10A is transported into a protective film forming apparatus (not shown in the drawings) and a protective film (over coating film) 20 is formed over the filter layers 111FR, 111FG, 111FB and the banks 16 in this protective film forming apparatus. After the protective film 20 has been formed over the filter layers 111FR, 111FG, 111FB and the banks 16, the protective film 20 is completely dried in the drying apparatus. Further, the protective film 20 is heated in a hardening apparatus (not shown in the drawings) to be completely hardened, by which the base 10A becomes a color filter substrate 10.

Figure 8:
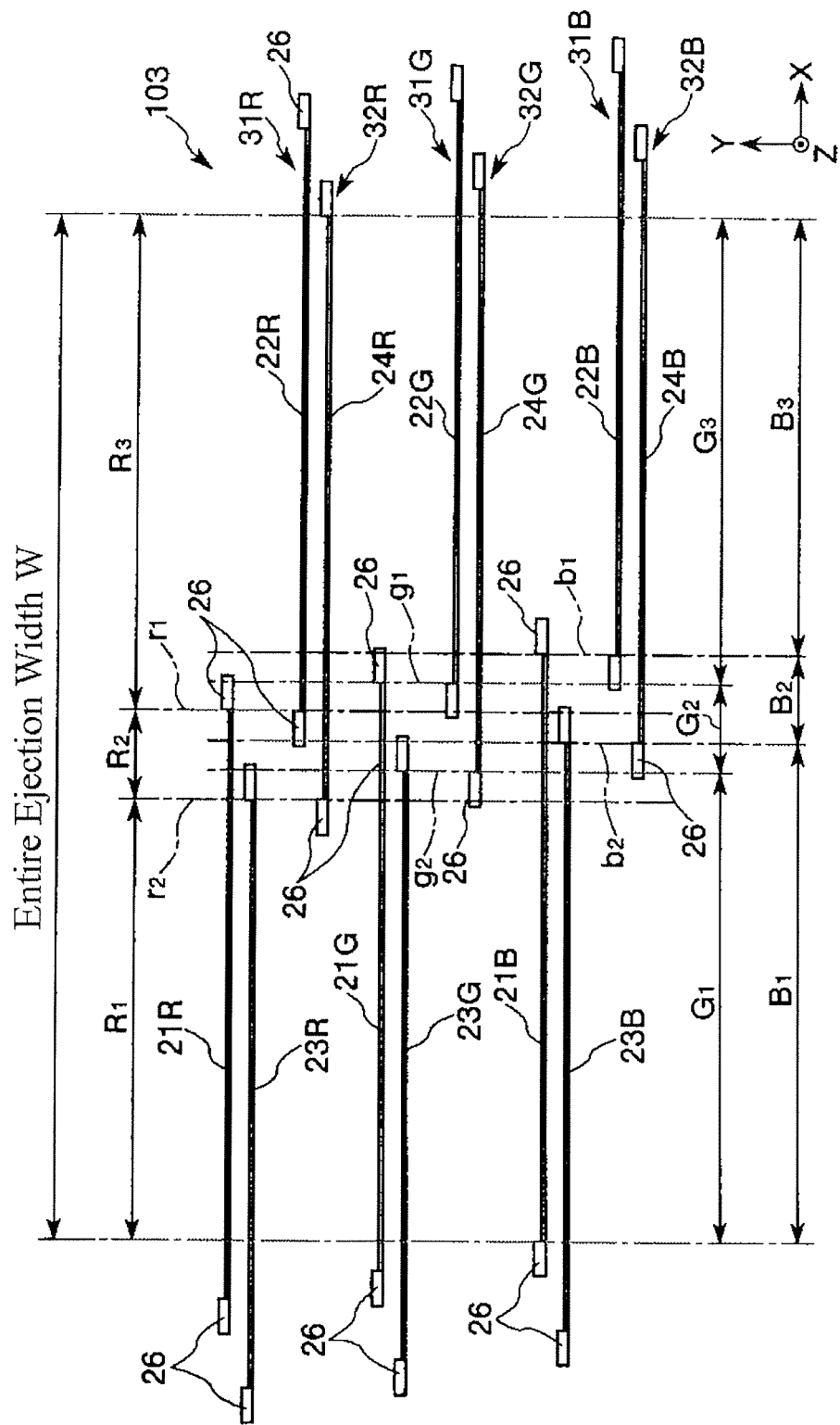
FIG. 8 is a schematic plan view which for explaining the positional relation of each of the droplet ejection heads in the head unit of the droplet ejection apparatus according to the present invention.

FIG. 8 is a schematic plan view which for explaining the positional relation of each of the droplet ejection heads 2 in the head unit 103 of the droplet ejection apparatus 1 according to the present invention. As described above, the four droplet ejection heads 2 for ejecting the red liquid material 111R (including the first to fourth droplet ejection heads 21R to 24R), the four droplet ejection heads 2 for ejecting the green liquid material 111G (including the first to fourth droplet ejection heads 21G to 24G) and the four droplet ejection heads 2 for ejecting the blue liquid material 111B (including the first to fourth droplet ejection heads 21B to 24B) are provided on the head unit 103. In this regard, each of the lines shown in FIG. 8 indicates the position of the nozzle array in each of the droplet ejection heads 2.

It is normally difficult to control the amount of ejection of each of the nozzles 25 in the vicinity of both ends of the nozzle array in each of the droplet ejection heads 2, by which an error of the amount of ejection of such nozzles is easily generated. For this reason, the droplet ejection apparatus 1 in the present embodiment is constructed so that the predetermined number (for example, about 10) of nozzles 25 in the vicinity of the both ends of the nozzle array in each of the droplet ejection heads 2 (hereinafter, such nozzles 25 may be referred to as "disable nozzles 25") are not used (that is, the liquid material 111 is not ejected through each of the disable nozzles 25). Thus, it is possible to uniformize the amount of ejection of the liquid material 111 in each of the nozzles 25, and this makes it possible to uniformize the color of each of the pixels 18R, 18G and 18B in the color filter substrate 10 to be manufactured. Therefore, it is possible to prevent color heterogeneity from being generated more surely. In this regard, nonuse portions 26 provided at the both ends of the nozzle array in each of the droplet ejection heads 2 shown in FIG. 8 indicate the regions in which the unable nozzles 25 are positioned.

Hereinafter, a description will be given for the positional relation of the four droplet ejection heads 2 including the first to fourth droplet ejection heads 21R to 24R for ejecting the red liquid material 111R.

The first droplet ejection head 21R and the second droplet ejection head 22R are arranged in a consecutive manner in a first direction (that is, X axis direction) parallel to each of the nozzle arrays, and the two nozzle arrays of the first and second droplet ejection heads 21R and 22R are arranged so that the nozzles 25 thereof are consecutive via a seam $r_1$ between the two adjacent nozzle arrays of the first and second droplet ejection heads 21R and 22R when viewed from a second direction (that is, Y axis direction) perpendicular to each of the nozzle arrays (the first direction). In this case, the two nozzle arrays of the first and second droplet ejection heads 21R and 22R function as a long nozzle array. In other words, a nozzle pitch at the seam $r_1$ when viewed from the Y axis direction is set to become a regular length similar to a nozzle pitch in the nozzle array. The head array constituted from the first and second droplet ejection heads 21R and 22R arranged with such a positional relation is referred to as a head array 31R.

In this regard, in consideration of the nonuse portions 26 of respective one ends of the first and second droplet ejection heads 21R and 22R, the first and second droplet ejection heads 21R and 22R are arranged so that the right end portion in FIG. 8 of the nozzle array in the first droplet ejection head 21R and the left end portion in FIG. 8 of the nozzle array in the second droplet ejection head 22R overlap each other in the vicinity of the seam $r_1$ of the nozzle arrays when viewed from the Y axis direction.

In a similar manner, the third droplet ejection head 23R and the fourth droplet ejection head 24R are arranged in a consecutive manner in the first direction (that is, X axis direction) parallel to each of the nozzle arrays, and the two nozzle arrays of the third and fourth droplet ejection heads 23R and 24R are arranged so that the nozzles 25 thereof are consecutive via a seam $r_2$ between the two adjacent nozzle arrays of the third and fourth droplet ejection heads 23R and 24R when viewed from the second direction (that is, Y axis direction) perpendicular to each of the nozzle arrays (the first direction). In this case, the two nozzle arrays of the third and fourth droplet ejection heads 23R and 24R function as a long nozzle array. In other words, a nozzle pitch at the seam $r_2$ when viewed from the Y axis direction is set to become a regular length similar to a nozzle pitch in the nozzle array. The head array constituted from the third and fourth droplet ejection heads 23R and 24R arranged with such a positional relation is referred to as a head array 32R.

In this regard, in consideration of the nonuse portions 26 of respective one ends of the third and fourth droplet ejection heads 23R and 24R, the third and fourth droplet ejection heads 23R and 24R are arranged so that the right end portion in FIG. 8 of the nozzle array in the third droplet ejection head 23R and the left end portion in FIG. 8 of the nozzle array in the fourth droplet ejection head 24R overlap each other in the vicinity of the seam $r_2$ of the nozzle arrays when viewed from the Y axis direction.

The long nozzle array formed from the head array 31R described above and the long nozzle array formed from the head array 32R described above are arranged by overlapping them so that the seams $r_1$ and $r_2$ are shifted with respect to each other in the X axis direction when viewed from the Y axis direction. The droplet ejection apparatus 1 can eject the liquid material 111R in the form of droplets onto one pixel 18R through the nozzles 25 of a plurality of different droplet ejection heads 2 (in the present embodiment, two droplet ejection heads 2) using such an overlap.

For example, in the case of the pixel 18R onto which the liquid material 111R is ejected in the form of droplets using an area indicated as $R_1$ in FIG. 8 where the first and third droplet ejection heads 21R and 23R are overlapped, as shown in FIG. 3, the droplets 91 ejected through the nozzles 25 of the first droplet ejection head 21R and the droplets 92 ejected through the nozzles 25 of the third droplet ejection head 23R are supplied thereto.

In this regard, in FIG. 3, although the position of the nozzles 25 in the head array 31R (herein, the first droplet ejection head 21R) and the position of the nozzles 25 in the head array 32R (herein, the third droplet ejection head 23R) are shifted with respect to each other in the X axis direction when viewed from the Y axis direction, the head arrays 31R and 32R may be arranged so that the positions of the nozzles in each of the head arrays 31R and 32R correspond with each other.

Although it is not shown in the drawings (in particular, in FIG. 3), in the case of the pixel 18R onto which the liquid material 111R is ejected in the form of droplets using an area indicated as $R_2$ in FIG. 8 where the first and fourth droplet ejection heads 21R and 24R are overlapped, the droplets ejected through the nozzles 25 of the first droplet ejection head 21R and the droplets ejected through the nozzles 25 of the fourth droplet ejection head 24R are supplied thereto. Further, in the case of the pixel 18R onto which the liquid material 111R is ejected in the form of droplets using an area indicated as $R_3$ in FIG. 8 where the second and fourth droplet ejection heads 22R and 24R are overlapped, the droplets ejected through the nozzles 25 of the second droplet ejection head 22R and the droplets ejected through the nozzles 25 of the fourth droplet ejection head 24R are supplied thereto.

That is to say, the above description may be mentioned as follows. The area to which the red liquid material 111R is adapted to be ejected from the plurality of droplet ejection heads 2 of the head unit 103 in the form of droplets by one main scanning movement (that is, mutual movement) of the head unit 103 with respect to the stage 106 (that is, the base 10A) is divided (separated) a plurality of sub-areas which are positioned in a direction perpendicular to the main scanning direction (mutual movement direction) that is, the X axis direction. In other words, the area is divided to three sub-areas including a sub-area to which the liquid material 111R is supplied by the nozzle arrays that are provided in the regions shown as $R_1$ in FIG. 8 (hereinafter, referred to as a "$R_1$ sub-area"), a sub-area to which the liquid material 111R is supplied by the nozzle arrays that are provided in the regions shown as $R_2$ in FIG. 8 (hereinafter, referred to as a "$R_2$ sub-area") and a sub-area to which the liquid material 111R is supplied by the nozzle arrays that are provided in the regions shown as $R_3$ in FIG. 8 (hereinafter, referred to as a "$R_3$ sub-area") via the seams $r_1$ and $r_2$ of the nozzle arrays via boundaries. The liquid material 111R ejected through the nozzles 25 of the different combination of the two droplet ejection heads 2 is supplied onto the pixels 18R in each of the sub-areas as described above. Namely, the plurality of droplet ejection heads 2 are arranged on the head unit 103 so that the pixels (ejection regions) 18R of each of the plurality of sub-areas including the $R_1$ sub-area, the $R_2$ sub-area and the $R_3$ sub-area are adapted to always receive the liquid material 111R in the form of droplets from the nozzles 25 of a different combination of two or more droplet ejection heads 2 in the plurality of droplet ejection heads 2.

The droplet ejection apparatus 1 operates so that the liquid material 111R is ejected in the form of droplets onto one pixel 18R through the nozzles 25 of the plurality of different droplet ejection heads 2. Therefore, even in the case where there is a variation (error) among the amounts of ejection of the plurality of droplet ejection heads 2, it is possible to prevent harmful color heterogeneity from being generated in a surface of a color filter substrate 10 to be manufactured from the base 10A using the head unit 103 of the droplet ejection apparatus 1. In other words, in contrast to the droplet ejection apparatus 1 of the present invention, in the case where the liquid material 111R is supplied onto one pixel 18R through the nozzles 25 of only one droplet ejection head 2, variations of the amounts of ejection of the droplet ejection heads 2 lead directly to a variation (error) of the amount of liquid material 111R to be supplied onto each of the pixels 18R, whereby color heterogeneity appears in the color filter substrate 10 strongly. On the other hand, in the droplet ejection apparatus 1 of the present invention, since the amount of liquid material 111R to be supplied onto one pixel 18R becomes the average of the amounts of ejection of the nozzles 25 in the plurality of droplet ejection heads 2 (in the present embodiment, two droplet ejection heads 2) overlapped in a scanning direction, it is possible to uniformize the amount of liquid material 111R supplied onto each of the pixels 18R, whereby it is possible to prevent the color heterogeneity from being generated.

Further, since the liquid material 111R is supplied to the pixels 18R in each of the three sub-areas including the $R_1$ sub-area, the $R_2$ sub-area and the $R_3$ sub-area through the nozzles 25 of the different combination of two droplet ejection heads 2 as described above, it is possible to balance (or average) the amount of ejection of the liquid material 111R onto each of the pixels 18R as the whole of the base 10A without biasing the amount of ejection of the liquid material 111R. Therefore, it is possible to prevent harmful color heterogeneity from being generated in a surface of a color filter substrate 10 to be manufactured more surely.

Moreover, the combination of two droplet ejection heads 2 for supplying the liquid material 111R onto the pixels 18R in the $R_1$ sub-area is constituted from the first droplet ejection head 21R and the third droplet ejection head 23R, while the combination of two droplet ejection heads 2 for supplying the liquid material 111R onto the pixels 18R in the $R_2$ sub-area neighboring the $R_1$ sub-area is constituted from the first droplet ejection head 21R and the fourth droplet ejection head 24R. These combinations of the two droplet ejection heads 2 use at least one common droplet ejection head 2, that is, the first droplet ejection head 21R.

In a similar manner, the combination of two droplet ejection heads 2 for supplying the liquid material 111R onto the pixels 18R in the $R_2$ sub-area is constituted from the first droplet ejection head 21R and the fourth droplet ejection head 24R, while the combination of two droplet ejection heads 2 for supplying the liquid material 111R onto the pixels 18R in the $R_3$ sub-area neighboring the $R_2$ sub-area is constituted from the second droplet ejection head 22R and the fourth droplet ejection head 24R. These combinations of the two droplet ejection heads 2 use at least one common droplet ejection head 2, that is, the fourth droplet ejection head 24R.

In this way, by using at least one common droplet ejection head 2 in the combination of droplet ejection heads 2 for ejecting the liquid material 111R in the form of droplets onto the pixels 18R in one sub-area and the combination of droplet ejection heads 2 for ejecting the liquid material 111R in the form of droplets onto the pixels 18R in another sub-area adjacent to the one sub-area, it is possible to reduce the error in the amount of ejection of the liquid material 111R at the boundary of the adjacent sub-areas. Therefore, it is possible to prevent color heterogeneity (including a streak described later) from becoming conspicuous at the boundary of each of the sub-areas on the base 10A more surely.

Further, in the droplet ejection apparatus 1, by constituting the head array 31R from the first and second droplet ejection heads 21R and 22R, the nozzle arrays of the first and second droplet ejection heads 21R and 22R function as a long nozzle array, while the nozzle arrays of the third and fourth droplet ejection heads 23R and 24R function as a long nozzle array by constituting the head array 32R from the third and fourth droplet ejection heads 23R and 24R. Thus, it is possible to enlarge the entire ejection width W (that is, the length of the head unit 103 in the X axis direction) in which the liquid material 111R can be ejected onto the base 10A through the nozzles 25 in the entire head unit 103. Therefore, it is possible to reduce the number of main scanning movements of the head unit 103 with respect to the base 10A required to eject the liquid material 111R onto the entire base 10A. In particular, in the case where the width of the base 10A is smaller than the entire ejection width W, it is possible to eject the liquid material 111R onto the whole of the base 10A by one main scanning movement.

Moreover, since the droplet ejection apparatus 1 is constructed so that the seam $r_1$ of the nozzle arrays in the head array 31R and the seam $r_2$ of the nozzle arrays in the head array 32R are shifted with respect to each other when viewed from the Y axis direction, the droplet ejection apparatus 1 has the following advantages.

Color heterogeneity appears in the pixels 18R onto which the liquid material 111R is supplied through the nozzles 25 in the vicinity of any seams of two adjacent nozzle arrays more easily than the pixels 18R provided at the other positions. As the cause thereof, the difficulty in controlling the amount of ejection of the nozzles 25 in the vicinity of the seam of the two adjacent nozzle arrays with high accuracy because such nozzles 25 are positioned near both ends of each of the nozzle arrays, an error of the nozzle pitch at the seam, and the like may be considered. In the case where color heterogeneity due to such a seam of nozzle arrays is generated, a so-called streak in which such color heterogeneity extends along the scanning direction of the droplet ejection heads 2 (that is, along the Y axis direction) like a line may appear in a color filter substrate 10 to be manufactured.

In the case where the streak described above is generated in the color filter substrate 10 when the position of the seam $r_1$ of the nozzle arrays in the head array 31R corresponds with the position of the seam $r_2$ of the nozzle arrays in the head array 32R, such two streaks overlap in the color filter substrate 10 to be manufactured, whereby such streaks become conspicuous. On the other hand, since the droplet ejection apparatus 1 is constructed so that the seam $r_1$ of the nozzle arrays in the head array 31R and the seam $r_2$ of the nozzle arrays in the head array 32R are shifted with respect to each other when viewed from the Y axis direction, the two steaks are dispersed at the positions of the seams $r_1$ and $r_2$ in the color filter substrate 10 to be manufactured. Therefore, it is possible to make such a streak become inconspicuous.

Next, a description will be given for the positional relation of the four droplet ejection heads 2 including first to fourth droplet ejection heads 21G to 24G for ejecting the green liquid material 111G. The positional relation of the four droplet ejection heads 2 including the first to fourth droplet ejection heads 21G to 24G for ejecting the green liquid material 111G is similar to the positional relation of the four droplet ejection heads 2 including the first to fourth droplet ejection heads 21R to 24R for ejecting the red liquid material 111R. For this reason, hereinafter, the description of such positional relation will be simplified.

The first droplet ejection head 21G and the second droplet ejection head 22G are arranged in a consecutive manner in the X axis direction parallel to each of the nozzle arrays, and the two nozzle arrays of the first and second droplet ejection heads 21G and 22G are arranged so that the nozzles 25 thereof are consecutive via a seam $g_1$ between the two adjacent nozzle arrays of the first and second droplet ejection heads 21G and 22G when viewed from the Y axis direction perpendicular to each of the nozzle arrays (that is, the X axis direction). In this case, the two nozzle arrays of the first and second droplet ejection heads 21G and 22G function as a long nozzle array. The head array constituted from the first and second droplet ejection heads 21G and 22G arranged with such a positional relation is referred to as a head array 31G.

In a similar manner, the third droplet ejection head 23G and the fourth droplet ejection head 24G are arranged in a consecutive manner in the X axis direction parallel to each of the nozzle arrays, and the two nozzle arrays of the third and fourth droplet ejection heads 23G and 24G are arranged so that the nozzles 25 thereof are consecutive via a seam $g_2$ between the two adjacent nozzle arrays of the third and fourth droplet ejection heads 23G and 24G when viewed from the Y axis direction perpendicular to each of the nozzle arrays (that is, the X axis direction). In this case, the two nozzle arrays of the third and fourth droplet ejection heads 23G and 24G function as a long nozzle array. The head array constituted from the third and fourth droplet ejection heads 23G and 24G arranged with such a positional relation is referred to as a head array 32G.

The long nozzle array formed from the head array 31G described above and the long nozzle array formed from the head array 32G described above are arranged by overlapping them so that the seams $g_1$ and $g_2$ are shifted with respect to each other in the X axis direction when viewed from the Y axis direction. The droplet ejection apparatus 1 can eject the liquid material 111G in the form of droplets onto one pixel 18G through the nozzles 25 of a plurality of different droplet ejection heads 2 (in the present embodiment, two droplet ejection heads 2) using such an overlap.

In other words, in the case of the pixel 18G onto which the liquid material 111G is ejected in the form of droplets using an area indicated as $G_1$ in FIG. 8 where the first and third droplet ejection heads 21G and 23G are overlapped, the droplets ejected through the nozzles 25 of the first droplet ejection head 21G and the droplets ejected through the nozzles 25 of the third droplet ejection head 23G are supplied thereto.

Further, in the case of the pixel 18G onto which the liquid material 111G is ejected in the form of droplets using an area indicated as $G_2$ in FIG. 8 where the first and fourth droplet ejection heads 21G and 24G are overlapped, the droplets ejected through the nozzles 25 of the first droplet ejection head 21G and the droplets ejected through the nozzles 25 of the fourth droplet ejection head 24G are supplied thereto. Moreover, in the case of the pixel 18G onto which the liquid material 111G is ejected in the form of droplets using an area indicated as $G_3$ in FIG. 8 where the second and fourth droplet ejection heads 22G and 24G are overlapped, the droplets ejected through the nozzles 25 of the second droplet ejection head 22G and the droplets ejected through the nozzles 25 of the fourth droplet ejection head 24G are supplied thereto.

That is to say, the above description may be mentioned as follows. The area to which the green liquid material 111G is adapted to be ejected from the plurality of droplet ejection heads 2 of the head unit 103 in the form of droplets by one main scanning movement (that is, mutual movement) of the head unit 103 with respect to the stage 106 (that is, the base 10A) is divided (separated) a plurality of sub-areas which are positioned in a direction perpendicular to the main scanning direction (mutual movement direction) that is, the X axis direction. In other words, the area is divided to three sub-areas including a sub-area to which the liquid material 111G is supplied by the nozzle arrays that are provided in the regions shown as G$_1$ in FIG. 8 (hereinafter, referred to as a "G$_1$ sub-area"), a sub-area to which the liquid material 111G is supplied by the nozzle arrays that are provided in the regions shown as G$_2$ in FIG. 8 (hereinafter, referred to as a "G$_2$ sub-area") and a sub-area to which the liquid material 111G is supplied by the nozzle arrays that are provided in the regions shown as G$_3$ in FIG. 8 (hereinafter, referred to as a "G$_3$ sub-area") via the seams g$_1$ and g$_2$ of the nozzle arrays via boundaries. The liquid material 111G ejected through the nozzles 25 of the different combination of the two droplet ejection heads 2 is supplied onto the pixels 18G in each of the sub-areas as described above. Namely, the plurality of droplet ejection heads 2 are arranged on the head unit 103 so that the pixels (ejection regions) 18G of each of the plurality of sub-areas including the G$_1$ sub-area, the G$_2$ sub-area and the G$_3$ sub-area are adapted to always receive the liquid material 111G in the form of droplets from the nozzles 25 of a different combination of two or more droplet ejection heads 2 in the plurality of droplet ejection heads 2.

In this way, the droplet ejection apparatus 1 operates so that the liquid material 111G is ejected in the form of droplets onto one pixel 18G through the nozzles 25 of the plurality of different droplet ejection heads 2. Therefore, even in the case where there is a variation (error) among the amounts of ejection of the plurality of droplet ejection heads 2, it is possible to prevent harmful color heterogeneity from being generated in a surface of a color filter substrate 10 to be manufactured from the base 10A using the head unit 103 of the droplet ejection apparatus 1. In other words, in contrast to the droplet ejection apparatus 1 of the present invention, in the case where the liquid material 111G is supplied onto one pixel 18G through the nozzles 25 of only one droplet ejection head 2, variations of the amounts of ejection of the droplet ejection heads 2 lead directly to a variation (error) of the amount of liquid material 111G to be supplied onto each of the pixels 18G, whereby color heterogeneity appears in the color filter substrate 10 strongly. On the other hand, in the droplet ejection apparatus 1 of the present invention, since the amount of liquid material 111G to be supplied onto one pixel 18G becomes the average of the amounts of ejection of the nozzles 25 in the plurality of droplet ejection heads 2 (in the present embodiment, two droplet ejection heads 2) overlapped in a scanning direction, it is possible to uniformize the amount of liquid material 111G supplied onto each of the pixels 18G, whereby it is possible to prevent the color heterogeneity from being generated.

Further, since the liquid material 111G is supplied to the pixels 18G in each of the three sub-areas including the G$_1$ sub-area, the G$_2$ sub-area and the G$_3$ sub-area through the nozzles 25 of the different combination of two droplet ejection heads 2 as described above, it is possible to balance (or average) the amount of ejection of the liquid material 111G onto each of the pixels 18G as the whole of the base 10A without biasing the amount of ejection of the liquid material 111G. Therefore, it is possible to prevent harmful color heterogeneity from being generated in a surface of a color filter substrate 10 to be manufactured more surely.

Moreover, the combination of two droplet ejection heads 2 for supplying the liquid material 111G onto the pixels 18G in the G$_1$ sub-area is constituted from the first droplet ejection head 21G and the third droplet ejection head 23G, while the combination of two droplet ejection heads 2 for supplying the liquid material 111G onto the pixels 18R in the G$_2$ sub-area neighboring the G$_1$ sub-area is constituted from the first droplet ejection head 21G and the fourth droplet ejection head 24G. These combinations of the two droplet ejection heads 2 use at least one common droplet ejection head 2, that is, the first droplet ejection head 21G.

In a similar manner, the combination of two droplet ejection heads 2 for supplying the liquid material 111G onto the pixels 18G in the G$_2$ sub-area is constituted from the first droplet ejection head 21G and the fourth droplet ejection head 24G, while the combination of two droplet ejection heads 2 for supplying the liquid material 111G onto the pixels 18G in the G$_3$ sub-area neighboring the G$_2$ sub-area is constituted from the second droplet ejection head 22G and the fourth droplet ejection head 24G. These combinations of the two droplet ejection heads 2 use at least one common droplet ejection head 2, that is, the fourth droplet ejection head 24G.

In this way, by using at least one common droplet ejection head 2 in the combination of droplet ejection heads 2 for ejecting the liquid material 111G in the form of droplets onto the pixels 18G in one sub-area and the combination of droplet ejection heads 2 for ejecting the liquid material 111G in the form of droplets onto the pixels 18G in another sub-area adjacent to the one sub-area, it is possible to reduce the error in the amount of ejection of the liquid material 111G at the boundary of the adjacent sub-areas. Therefore, it is possible to prevent color heterogeneity (including a streak described later) from becoming conspicuous at the boundary of each of the sub-areas on the base 10A more surely.

Further, in the droplet ejection apparatus 1, by constituting the head array 31G from the first and second droplet ejection heads 21G and 22G, the nozzle arrays of the first and second droplet ejection heads 21G and 22G function as a long nozzle array, while the nozzle arrays of the third and fourth droplet ejection heads 23G and 24G function as a long nozzle array by constituting the head array 32G from the third and fourth droplet ejection heads 23G and 24G. Thus, it is possible to enlarge the entire ejection width W (that is, the length of the head unit 103 in the X axis direction) in which the liquid material 111G can be ejected onto the base 10A through the nozzles 25 in the entire head unit 103. Therefore, it is possible to reduce the number of main scanning movements of the head unit 103 with respect to the base 10A required to eject the liquid material 111G onto the entire base 10A. In particular, in the case where the width of the base 10A is smaller than the entire ejection width W, it is possible to eject the liquid material 111G onto the whole of the base 10A by one main scanning movement.

Moreover, since the droplet ejection apparatus 1 is constructed so that the seam g$_1$ of the nozzle arrays in the head array 31G and the seam g$_2$ of the nozzle arrays in the head array 32G are shifted with respect to each other when viewed from the Y axis direction, the droplet ejection apparatus 1 has the following advantages.

Color heterogeneity appears in the pixels 18G onto which the liquid material 111G is supplied through the nozzles 25 in the vicinity of any seams of two adjacent nozzle arrays more easily than the pixels 18G provided at the other positions. As the cause thereof, the difficulty in controlling the amount of ejection of the nozzles 25 in the vicinity of the seam of the two adjacent nozzle arrays with high accuracy because such nozzles 25 are positioned near both ends of each of the nozzle arrays, an error of the nozzle pitch at the seam, and the like may be considered. In the case where color heterogeneity due to such a seam of nozzle arrays is generated, a so-called streak in which such color heterogeneity extends along the scanning direction of the droplet ejection heads 2 (that is, along the Y axis direction) like a line may appear in a color filter substrate 10 to be manufactured.

In the case where the streak described above is generated in the color filter substrate 10 when the position of the seam $g_1$ of the nozzle arrays in the head array 31G corresponds with the position of the seam $g_2$ of the nozzle arrays in the head array 32G, such two streaks overlap in the color filter substrate 10 to be manufactured, whereby such streaks become conspicuous. On the other hand, since the droplet ejection apparatus 1 is constructed so that the seam $g_1$ of the nozzle arrays in the head array 31G and the seam $g_2$ of the nozzle arrays in the head array 32G are shifted with respect to each other when viewed from the Y axis direction, the two steaks are dispersed at the positions of the seams $g_1$ and $g_2$ in the color filter substrate 10 to be manufactured. Therefore, it is possible to make such a streak become inconspicuous.

Next, a description will be given for the positional relation of the four droplet ejection heads 2 including first to fourth droplet ejection heads 21B to 24B for ejecting the blue liquid material 111B. The positional relation of the four droplet ejection heads 2 including the first to fourth droplet ejection heads 21B to 24B for ejecting the blue liquid material 111B is similar to the positional relation of the four droplet ejection heads 2 including the first to fourth droplet ejection heads 21R to 24R for ejecting the red liquid material 111R. For this reason, hereinafter, the description of such positional relation will be simplified.

The first droplet ejection head 21B and the second droplet ejection head 22B are arranged in a consecutive manner in the X axis direction parallel to each of the nozzle arrays, and the two nozzle arrays of the first and second droplet ejection heads 21B and 22B are arranged so that the nozzles 25 thereof are consecutive via a seam $b_1$ between the two adjacent nozzle arrays of the first and second droplet ejection heads 21B and 22B when viewed from the Y axis direction perpendicular to each of the nozzle arrays (that is, the X axis direction). In this case, the two nozzle arrays of the first and second droplet ejection heads 21B and 22B function as a long nozzle array. The head array constituted from the first and second droplet ejection heads 21B and 22B arranged with such a positional relation is referred to as a head array 31B.

In a similar manner, the third droplet ejection head 23B and the fourth droplet ejection head 24B are arranged in a consecutive manner in the X axis direction parallel to each of the nozzle arrays, and the two nozzle arrays of the third and fourth droplet ejection heads 23B and 24B are arranged so that the nozzles 25 thereof are consecutive via a seam $b_2$ between the two adjacent nozzle arrays of the third and fourth droplet ejection heads 23B and 24B when viewed from the Y axis direction perpendicular to each of the nozzle arrays (that is, the X axis direction). In this case, the two nozzle arrays of the third and fourth droplet ejection heads 23B and 24B function as a long nozzle array. The head array constituted from the third and fourth droplet ejection heads 23B and 24B arranged with such a positional relation is referred to as a head array 32B.

The long nozzle array formed from the head array 31B described above and the long nozzle array formed from the head array 32B described above are arranged by overlapping them so that the seams $b_1$ and $b_2$ are shifted with respect to each other in the X axis direction when viewed from the Y axis direction. The droplet ejection apparatus 1 can eject the liquid material 111B in the form of droplets onto one pixel 18B through the nozzles 25 of a plurality of different droplet ejection heads 2 (in the present embodiment, two droplet ejection heads 2) using such an overlap.

In other words, in the case of the pixel 18B onto which the liquid material 111B is ejected in the form of droplets using an area indicated as $B_1$ in FIG. 8 where the first and third droplet ejection heads 21B and 23B are overlapped, the droplets ejected through the nozzles 25 of the first droplet ejection head 21B and the droplets ejected through the nozzles 25 of the third droplet ejection head 23B are supplied thereto.

Further, in the case of the pixel 18B onto which the liquid material 111B is ejected in the form of droplets using an area indicated as $B_2$ in FIG. 8 where the first and fourth droplet ejection heads 21B and 24B are overlapped, the droplets ejected through the nozzles 25 of the first droplet ejection head 21B and the droplets ejected through the nozzles 25 of the fourth droplet ejection head 24B are supplied thereto. Moreover, in the case of the pixel 18B onto which the liquid material 111B is ejected in the form of droplets using an area indicated as $B_3$ in FIG. 8 where the second and fourth droplet ejection heads 22B and 24B are overlapped, the droplets ejected through the nozzles 25 of the second droplet ejection head 22B and the droplets ejected through the nozzles 25 of the fourth droplet ejection head 24B are supplied thereto.

That is to say, the above description may be mentioned as follows. The area to which the blue liquid material 111B is adapted to be ejected from the plurality of droplet ejection heads 2 of the head unit 103 in the form of droplets by one main scanning movement (that is, mutual movement) of the head unit 103 with respect to the stage 106 (that is, the base 10A) is divided (separated) a plurality of sub-areas which are positioned in a direction perpendicular to the main scanning direction (mutual movement direction) that is, the X axis direction. In other words, the area is divided to three sub-areas including a sub-area to which the liquid material 111B is supplied by the nozzle arrays that are provided in the regions shown as $B_1$ in FIG. 8 (hereinafter, referred to as a "$B_1$ sub-area"), a sub-area to which the liquid material 111B is supplied by the nozzle arrays that are provided in the regions shown as $B_2$ in FIG. 8 (hereinafter, referred to as a "$B_2$ sub-area") and a sub-area to which the liquid material 111B is supplied by the nozzle arrays that are provided in the regions shown as $B_3$ in FIG. 8 (hereinafter, referred to as a "$B_3$ sub-area") via the seams $b_1$ and $b_2$ of the nozzle arrays via boundaries. The liquid material 111B ejected through the nozzles 25 of the different combination of the two droplet ejection heads 2 is supplied onto the pixels 18B in each of the sub-areas as described above. Namely, the plurality of droplet ejection heads 2 are arranged on the head unit 103 so that the pixels (ejection regions) 18B of each of the plurality of sub-areas including the $B_1$ sub-area, the $B_2$ sub-area and the $B_3$ sub-area are adapted to always receive the liquid material 111B in the form of droplets from the nozzles 25 of a different combination of two or more droplet ejection heads 2 in the plurality of droplet ejection heads 2.

In this way, the droplet ejection apparatus 1 operates so that the liquid material 111B is ejected in the form of droplets onto one pixel 18B through the nozzles 25 of the plurality of different droplet ejection heads 2. Therefore, even in the case where there is a variation (error) among the amounts of ejection of the plurality of droplet ejection heads 2, it is possible to prevent harmful color heterogeneity from being generated in a surface of a color filter substrate 10 to be manufactured from the base 10A using the head unit 103 of the droplet ejection apparatus 1. In other words, in contrast to the droplet ejection apparatus 1 of the present invention, in the case where the liquid material 111B is supplied onto one pixel 18B through the nozzles 25 of only one droplet ejection head 2, variations of the amounts of ejection of the droplet ejection heads 2 lead directly to a variation (error) of the amount of liquid material 111B to be supplied onto each of the pixels 18B, whereby color heterogeneity appears in the color filter substrate 10 strongly. On the other hand, in the droplet ejection apparatus 1 of the present invention, since the amount of liquid material 111B to be supplied onto one pixel 18B becomes the average of the amounts of ejection of the nozzles 25 in the plurality of droplet ejection heads 2 (in the present embodiment, two droplet ejection heads 2) overlapped in a scanning direction, it is possible to uniformize the amount of liquid material 111B supplied onto each of the pixels 18B, whereby it is possible to prevent the color heterogeneity from being generated.

Further, since the liquid material 111B is supplied to the pixels 18B in each of the three sub-areas including the $B_1$ sub-area, the $B_2$ sub-area and the $B_3$ sub-area through the nozzles 25 of the different combination of two droplet ejection heads 2 as described above, it is possible to balance (or average) the amount of ejection of the liquid material 111B onto each of the pixels 18B as the whole of the base 10A without biasing the amount of ejection of the liquid material 111B. Therefore, it is possible to prevent harmful color heterogeneity from being generated in a surface of a color filter substrate 10 to be manufactured more surely.

Moreover, the combination of two droplet ejection heads 2 for supplying the liquid material 111B onto the pixels 18B in the $B_1$ sub-area is constituted from the first droplet ejection head 21B and the third droplet ejection head 23B, while the combination of two droplet ejection heads 2 for supplying the liquid material 111B onto the pixels 18B in the $B_2$ sub-area neighboring the $B_1$ sub-area is constituted from the first droplet ejection head. 21B and the fourth droplet ejection head 24B. These combinations of the two droplet ejection heads 2 use at least one common droplet ejection head 2, that is, the first droplet ejection head 21B.

In a similar manner, the combination of two droplet ejection heads 2 for supplying the liquid material 111B onto the pixels 18B in the $B_2$ sub-area is constituted from the first droplet ejection head 21B and the fourth droplet ejection head 24B, while the combination of two droplet ejection heads 2 for supplying the liquid material 111B onto the pixels 18B in the $B_3$ sub-area neighboring the $B_2$ sub-area is constituted from the second droplet ejection head 22B and the fourth droplet ejection head 24B. These combinations of the two droplet ejection heads 2 use at least one common droplet ejection head 2, that is, the fourth droplet ejection head 24B.

In this way, by using at least one common droplet ejection head 2 in the combination of droplet ejection heads 2 for ejecting the liquid material 111B in the form of droplets onto the pixels 18B in one sub-area and the combination of droplet ejection heads 2 for ejecting the liquid material 111B in the form of droplets onto the pixels 18B in another sub-area adjacent to the one sub-area, it is possible to reduce the error in the amount of ejection of the liquid material 111B at the boundary of the adjacent sub-areas. Therefore, it is possible to prevent color heterogeneity (including a streak described later) from becoming conspicuous at the boundary of each of the sub-areas on the base 10A more surely.

Further, in the droplet ejection apparatus 1, by constituting the head array 31B from the first and second droplet ejection heads 21B and 22B, the nozzle arrays of the first and second droplet ejection heads 21B and 22B function as a long nozzle array, while the nozzle arrays of the third and fourth droplet ejection heads 23B and 24B function as a long nozzle array by constituting the head array 32B from the third and fourth droplet ejection heads 23B and 24B. Thus, it is possible to enlarge the entire ejection width W (that is, the length of the head unit 103 in the X axis direction) in which the liquid material 111B can be ejected onto the base 10A through the nozzles 25 in the entire head unit 103. Therefore, it is possible to reduce the number of main scanning movements of the head unit 103 with respect to the base 10A required to eject the liquid material 111B onto the entire base 10A. In particular, in the case where the width of the base 10A is smaller than the entire ejection width W, it is possible to eject the liquid material 111B onto the whole of the base 10A by one main scanning movement.

Moreover, since the droplet ejection apparatus 1 is constructed so that the seam $b_1$ of the nozzle arrays in the head array 31B and the seam $b_2$ of the nozzle arrays in the head array 32B are shifted with respect to each other when viewed from the Y axis direction, the droplet ejection apparatus 1 has the following advantages.

Color heterogeneity appears in the pixels 18B onto which the liquid material 111B is supplied through the nozzles 25 in the vicinity of any seams of two adjacent nozzle arrays more easily than the pixels 18B provided at the other positions. As the cause thereof, the difficulty in controlling the amount of ejection of the nozzles 25 in the vicinity of the seam of the two adjacent nozzle arrays with high accuracy because such nozzles 25 are positioned near both ends of each of the nozzle arrays, an error of the nozzle pitch at the seam, and the like may be considered. In the case where color heterogeneity due to such a seam of nozzle arrays is generated, a so-called streak in which such color heterogeneity extends along the scanning direction of the droplet ejection heads 2 (that is, along the Y axis direction) like a line may appear in a color filter substrate 10 to be manufactured.

In the case where the streak described above is generated in the color filter substrate 10 when the position of the seam $b_1$ of the nozzle arrays in the head array 31B corresponds with the position of the seam $b_2$ of the nozzle arrays in the head array 32B, such two streaks overlap in the color filter substrate 10 to be manufactured, whereby such streaks become conspicuous. On the other hand, since the droplet ejection apparatus 1 is constructed so that the seam $b_1$ of the nozzle arrays in the head array 31B and the seam $b_2$ of the nozzle arrays in the head array 32B are shifted with respect to each other when viewed from the Y axis direction, the two steaks are dispersed at the positions of the seams $b_1$ and $b_2$ in the color filter substrate 10 to be manufactured. Therefore, it is possible to make such a streak become inconspicuous.

In such a head unit 103, the two long nozzle array respectively formed from the head arrays 31R and 32R for ejecting the red liquid material 111R, the two long nozzle array respectively formed from the head arrays 31G and 32G for ejecting the green liquid material 111G, and the two long nozzle array respectively formed from the head arrays 31B and 32B for ejecting the blue liquid material 111B are arranged so as to be overlapped with respect to each other when viewed from the Y axis direction. This makes it possible to respectively supply the red, green and blue liquid materials 111R, 111G and 111B onto the pixels 18R, 18G and 18B in the entire ejection width W once by carrying out the scanning movement of the head unit 103 with the base 10A.

Further, in the droplet ejection apparatus 1, the seams $r_1$ and $r_2$ of the nozzle arrays in the head array 31R and 32R for ejecting the red liquid material 111R, the seams $g_1$ and $g_2$ of the nozzle arrays in the head array 31G and 32G for ejecting the red liquid material 111G, and the seams $b_1$ and $b_2$ of the nozzle arrays in the head array 31B and 32B for ejecting the red liquid material 111B are arranged so as to be shifted when viewed from the Y axis direction.

That is to say, the head unit 103 of the droplet ejection apparatus 1 is constructed so that the positions of the boundaries among the $R_1$ sub-area, the $R_2$ sub-area and $R_3$ sub-area with respect to the red pixels 18R on the base 10A, the positions of the boundaries among the $G_1$ sub-area, the $G_2$ sub-area and $G_3$ sub-area with respect to the green pixels 18G on the base 10A, and the positions of the boundaries among the $B_1$ sub-area, the $B_2$ sub-area and $B_3$ sub-area with respect to the blue pixels 18B on the base 10A do not correspond with each other.

Thus, in the color filter substrate 10 to be manufactured, the streak that may be generated on any red pixels 18R, the streak that may be generated on any green pixels 18G, the streak that may be generated on any blue pixels 18B can be dispersed with respect to each other. Therefore, it is possible to prevent such streaks from becoming conspicuous more surely. In particular, in the present embodiment, since the positions of the seams $r_2$, $g_2$, $b_2$, $r_1$, $g_1$, and $b_1$ of the nozzle arrays are positioned at even intervals when viewed from the Y axis direction, it is possible to disperse the streaks regularly even in the case where the streaks somewhat become conspicuous. Therefore, it is possible to make such streaks become inconspicuous.

Figure 9:
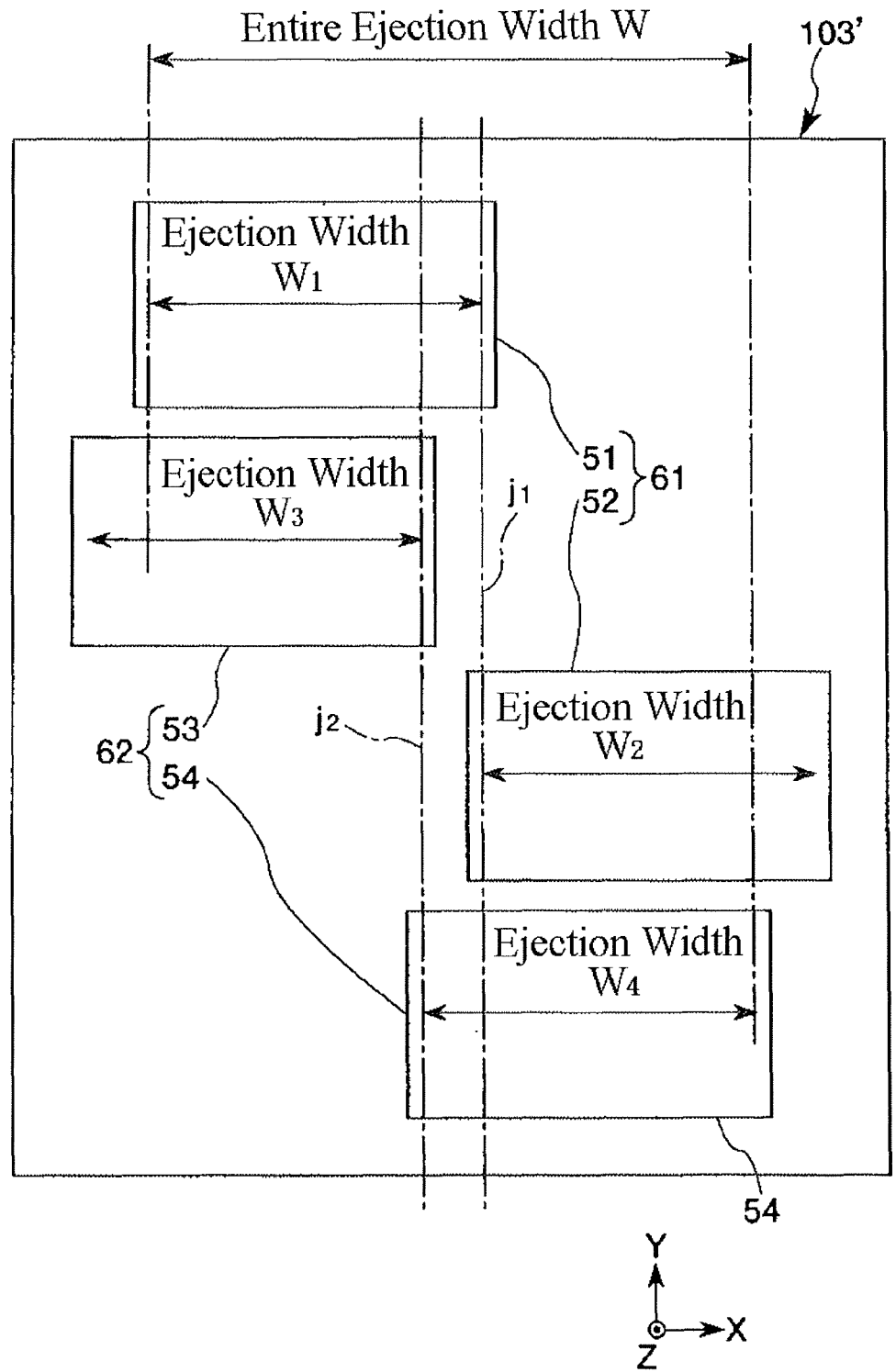
FIG. 9 is a plan view which schematically shows another example of the configuration of the head unit in the droplet ejection apparatus of the present invention.

FIG. 9 is a plan view which schematically shows another example of the configuration of the head unit 103' in the droplet ejection apparatus 1 of the present invention. Four droplet ejection heads 51, 52, 53 and 54 are provided in the head unit 103' shown in FIG. 9. Each of the droplet ejection heads 51, 52, 53 and 54 includes a plurality of nozzle arrays (in the present embodiment, 12 nozzle arrays) which are arranged in a side by side relation in the Y axis direction so that both ends of the 12 nozzle arrays in each of the plurality of droplet ejection heads 51, 52, 53 and 54 are aligned when viewed from the Y axis direction. Thus, the 48 nozzle arrays of the four droplet ejection heads 51, 52, 53 and 54 are provided in the head unit 103'. Each of the droplet ejection heads 51, 52, 53 and 54 are arranged in the similar manner to those in the head unit 103 described above (see FIG. 8). In this regard, for simplification, each of the droplet ejection heads 51, 52, 53 and 54 are indicated as a simple rectangle in FIG. 9.

The droplet ejection head 51 and the droplet ejection head 52 are arranged in a consecutive manner in the X axis direction parallel to each of the nozzle arrays, and the 24 nozzle arrays of the droplet ejection heads 51 and 52 are arranged so that the nozzles 25 thereof are consecutive via a seam $j_1$ between the two adjacent droplet ejection heads 51 and 52 when viewed from the Y axis direction perpendicular to each of the nozzle arrays. In this case, the two droplet ejection heads 51 and 52 function as a head group array 61.

In a similar manner, the droplet ejection head 53 and the droplet ejection head 54 are arranged in a consecutive manner in the X axis direction parallel to each of the nozzle arrays, and the 24 nozzle arrays of the droplet ejection heads 53 and 54 are arranged so that the nozzles 25 thereof are consecutive via a seam $j_2$ between the two adjacent droplet ejection heads 51 and 52 when viewed from the Y axis direction perpendicular to each of the nozzle arrays. In this case, the two droplet ejection heads 53 and 54 function as a head group array 62. The head group array 61 and the head group array 62 described above are arranged by overlapping them so that the seams $j_1$ and $j_2$ are shifted with respect to each other in the X axis direction when viewed from the Y axis direction.

In the droplet ejection apparatus 1 provided with such a head unit 103', the liquid material 111 ejected from the two droplet ejection heads (that is, the two droplet ejection heads 51 and 53, 51 and 54, or 53 and 54) is supplied onto each of the pixels 18R, 18G or 18B. This makes it possible to further uniformize the amount of the liquid material 111 to be sup- plied onto each of the pixels 18R, 18G or 18B at any position of the base 10A. Therefore, it is possible to prevent color heterogeneity from being generated in a surface of a color filter substrate 10 to be manufactured more surely.

Further, since the ejection width $W_1$ of the droplet ejection head 51 and the ejection width $W_2$ of the droplet ejection head 52 function of being linked and the ejection width $W_3$ of the droplet ejection head 53 and the ejection width $W_4$ of the droplet ejection head 54 function of being linked, it is possible to enlarge the length of the head unit 103' in the X axis direction (that is, the entire ejection width W in FIG. 9) in which the liquid material 111 can be ejected onto the base 10A through the nozzles 25 in the entire head unit 103'.

Moreover, since the droplet ejection apparatus 1 of the present embodiment is constructed so that the seam $j_1$ of the nozzle arrays in the head group array 61 and the seam $j_2$ of the nozzle arrays in the head group array 62 are shifted with respect to each other when viewed from the Y axis direction, the steak that may be generated due to the seam $j_1$ and the steak that may be generated due to the seam $j_2$ can be dispersed at separate points in the color filter substrate 10 to be manufactured. Therefore, it is possible to prevent the streaks from becoming conspicuous more surely.

The present invention that has been described above can be applied to not only the case of manufacturing the color filter substrate 10 but also the case of manufacturing other type of image display apparatus such as an electroluminescence display.

Figure 10:
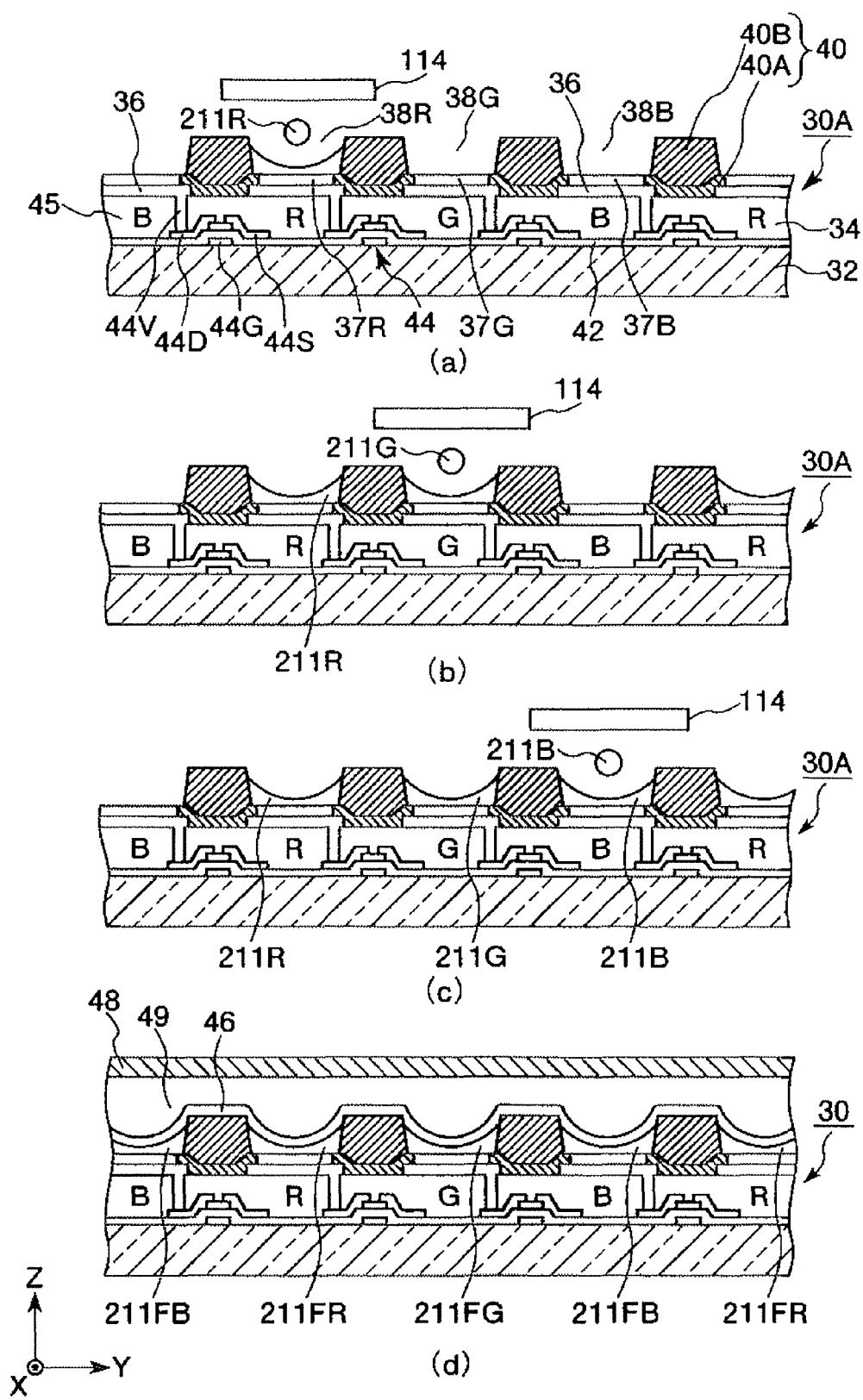
FIG. 10 is a schematic cross-sectional view which shows a method of manufacturing an organic electroluminescence display.

FIG. 10 is a schematic cross-sectional view which shows a method of manufacturing an organic electroluminescence display 30. Hereinafter, an explanation will be given for the case of manufacturing the organic electroluminescence display 30 using the present invention; however, differences between the case of manufacturing the color filter substrate 10 described above and the case of manufacturing the organic electroluminescence display 30 are chiefly described, and the description of the similar explanations is omitted.

A base 30A shown in FIG. 10 is a substrate used for manufacturing an organic electro-luminescence display 30. The base 30A has a plurality of pixels (that is, a plurality of ejection regions) 38R, 38G and 38B arranged thereon in a matrix manner.

More specifically, the base 30A includes a supporting substrate 32, a circuit element layer 34 formed on the supporting substrate 32, a plurality of pixel electrodes 36 formed on the circuit element layer 34, and a plurality of banks 40 formed between the adjacent two of the plurality of pixel electrodes 36. The supporting substrate 32 has light permeability with respect to visible light (optical wavelength), such as a glass substrate. Each of the plurality of pixel electrodes 36 also has light permeability with respect to visible light (optical wavelength), such as an ITO (Indium-Tin Oxide) electrode. Further, the plurality of pixel electrodes 36 are arranged on the circuit element layer 34 in a matrix manner, and each of the pixel electrodes 36 defines a pixel. Each of the banks 40 has a lattice-like structure, and each of the plurality of pixel electrodes 36 is surrounded with predetermined banks 40. Moreover, the banks 40 are constituted from inorganic banks 40A formed on the circuit element layer 34, and organic banks 40B positioned on the inorganic banks 40A.

The circuit element layer 34 is a layer provided with: a plurality of scanning electrodes each extending toward a predetermined direction on the supporting substrate 32; an insulating film 42 formed so as to cover the plurality of scanning electrodes; a plurality of signal electrodes provided on the insulating film 42 and each extending toward a direction perpendicular to the predetermined direction toward which each of the plurality of scanning electrodes extends; a plurality of switching elements 44 each provided in the vicinity of intersection point between the scanning electrode and the signal electrode; and a plurality of interlayer insulating films 45 formed so as to cover the plurality of switching elements 44 such as polyimide. A gate electrode 44G and a source electrode 44S of each of the switching elements 44 are electrically connected to the corresponding scanning electrode and the corresponding signal electrode, respectively. The plurality of pixel electrodes 36 are positioned on the interlayer insulating film 45. A plurality of through-holes 44V are provided at portions corresponding to drain electrodes 44D of the switching elements 44, and the switching elements 44 are electrically connected to the corresponding pixel electrodes 36 via the through-holes 44V, respectively. Further, the switching elements 44 are provided at the positions corresponding to the banks 44, respectively. In other words, when viewed from the upper side in FIG. 10, each of the plurality of switching elements 44 is positioned so as to be covered with the corresponding bank 40.

Concave portions each defined by the pixel electrode 36 and the corresponding banks 40 correspond to the pixels 38R, 38G and 38B, respectively. The pixel 38R is a region in which a luminous layer 211FR through which light having a wavelength within a red wavelength region is emitted is to be formed. The pixel 38G is a region in which a luminous layer 211FG through which light having a wavelength within a green wavelength region is emitted is to be formed. The pixel 38B is a region in which a luminous layer 211FB through which light having a wavelength within a blue wavelength region is emitted is to be formed.

It is possible to manufacture such a base 30A using a known film forming technology and a patterning technology.

First, the base 30A is made to become lyophilic by means of an oxygen plasma process under atmospheric pressure. The surface of the pixel electrodes 36, the surface of the inorganic banks 40A and the surface of the organic banks 40B in the pixels 38R, 38G and 38B, each of which is defined by the pixel electrodes 36 and the banks 40, tend to take on lyophilic by this process. Further, a plasma process using $CF_4$ as a process gas is then carried out to the base 30A. By the plasma process using $CF_4$, the surface of the organic banks 40B in each of the concave portions is fluorinated, and the surface of the organic banks 40B tends to take on non-lyophilic by this process. In this regard, by the plasma process using $CF_4$, the surface of the pixel electrodes 36 and the surface of the inorganic banks 40A that have taken on lyophilic previously lose the lyophilic slightly. However, even so, these surfaces can maintain lyophilic.

In this regard, in accordance with the material of the pixel electrodes 36, the material of the inorganic banks 40A, and the material of the organic banks 40B, the surface of each of the concave portions may take on desired lyophilic and non-lyophilic without the surface treatment described above. In such a case, it is no need for the surface to be subjected to the surface treatment described above.

Further, corresponding hole transport layers 37R, 37G and 37B may be formed on each of the plurality of pixel electrodes 36 thus subjected to the surface treatment. In the case where the hole transport layers 37R, 37G and 37B are respectively positioned between the pixel electrodes 36 and luminous layers 211FR, 211FG and 211FB, it is possible to improve luminous efficiency of the electro-luminescence display.

As shown in FIGS. 10(*a*) to 10(*c*), liquid materials 211R, 211G and 211B are respectively supplied onto the base 30A on which the pixels 38R, 38G and 38B are formed as described above in the similar to the case of the color filter substrate 10 described above using the droplet ejection apparatus 1 of the present invention. In this case, the liquid material 211R includes a red organic luminescent material, the liquid material 211G includes a green organic luminescent material, and the liquid material 211B includes a blue luminescent material.

The base 30A is then transferred into the drying apparatus. Luminous layers 211FR, 211FG and 211FB are obtained on each of the pixels 38R, 38G and 38B by drying the liquid materials 211R, 211G and 211B supplied onto each of the pixels 38R, 38G and 38B.

Next, counter electrodes 46 are formed so as to cover the luminous layers 211FR, 211FG and 211FB and the banks 40. Each of the counter electrodes 46 functions as a negative electrode.

Subsequently, by joining a sealing substrate 48 to the base 30A with their peripheral portions, the organic electro-luminescence display 30 shown in FIG. 10(*d*) is obtained. In this regard, an inert gas is encapsulated between the sealing substrate 48 and the base 30A.

In the organic electro-luminescence display 30, light emitted from the luminous layers 211FR, 211FG and 211FB is emitted to outside through the pixel electrodes 36, the circuit element layers 34 and the supporting substrate 32. An organic electro-luminescence display in which light is emitted through the circuit element layer 34 in this manner is called as a bottom emission type display.

Although the cases where the present invention is applied to a method of manufacturing a liquid crystal display (color filter substrate) and an organic electro-luminescence display have been described based on the preferred embodiment shown in the drawings, it should be noted that the present invention is not limited to the embodiment described above. For example, it is possible to apply the present invention to a method of manufacturing a back substrate of a plasma display, or an image display provided with electron emission elements (which is also referred as to a SED (Surface-Conduction Electron-Emitter Display) or a FED (Field Emission Display)).

<Embodiment of Electronic Device>

An image display apparatus 1000 such as a liquid crystal display provided with the color filter substrate 10 manufactured using the method described above, and the organic electro-luminescence display manufactured using the method described above (that is, an electronic apparatus of the present invention) can be utilized as a display portion of each of various types of electronic apparatuses.

Figure 11:
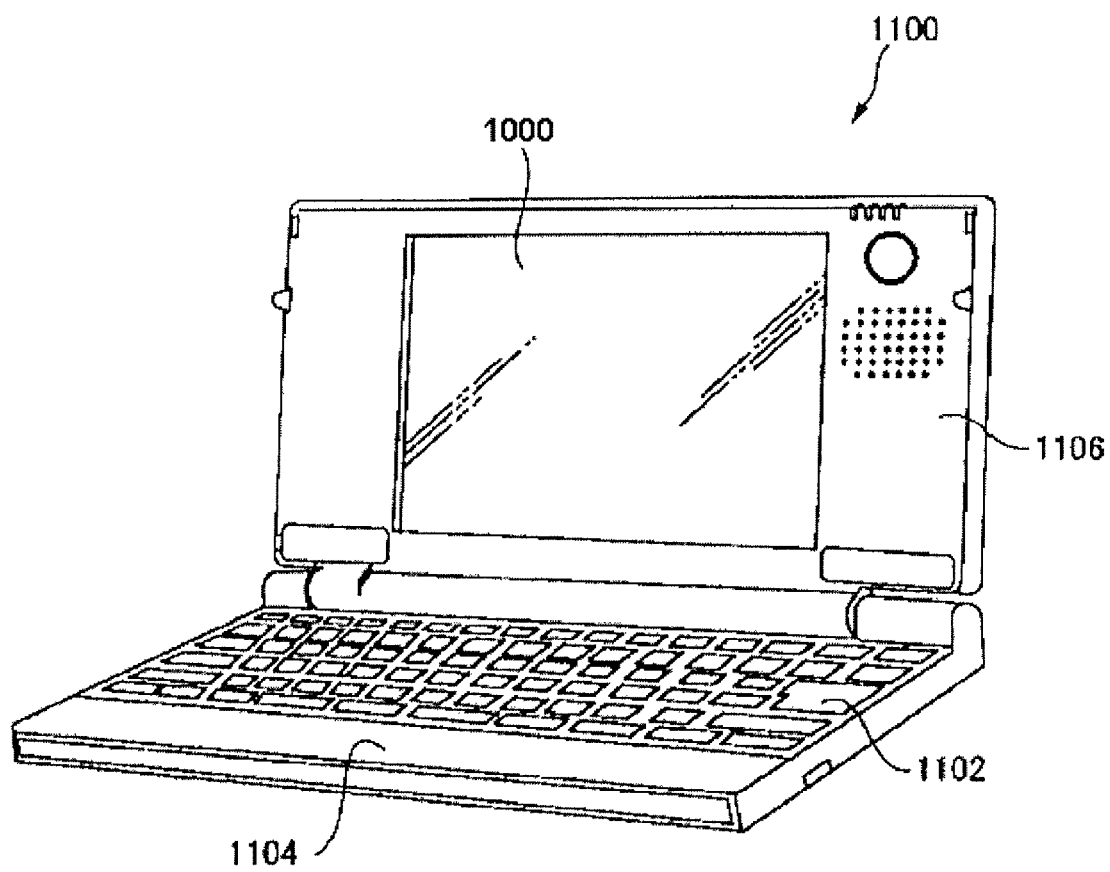
FIG. 11 is a perspective view which shows a structure of a mobile (or laptop type) personal computer to which an electronic apparatus of the present invention is applied.

FIG. 11 is a perspective view which shows a structure of a mobile (or laptop type) personal computer 1100 to which an electronic apparatus of the present invention is applied. Referring to FIG. 11, the personal computer 1100 is provided with a body 1104 having a keyboard 1102, and a display unit 1106. The display unit 1106 is rotatably supported on the body 1104 via a hinge portion. In this personal computer 1100, the display unit 1106 is provided with the image display apparatus 1000 described above.

Figure 12:
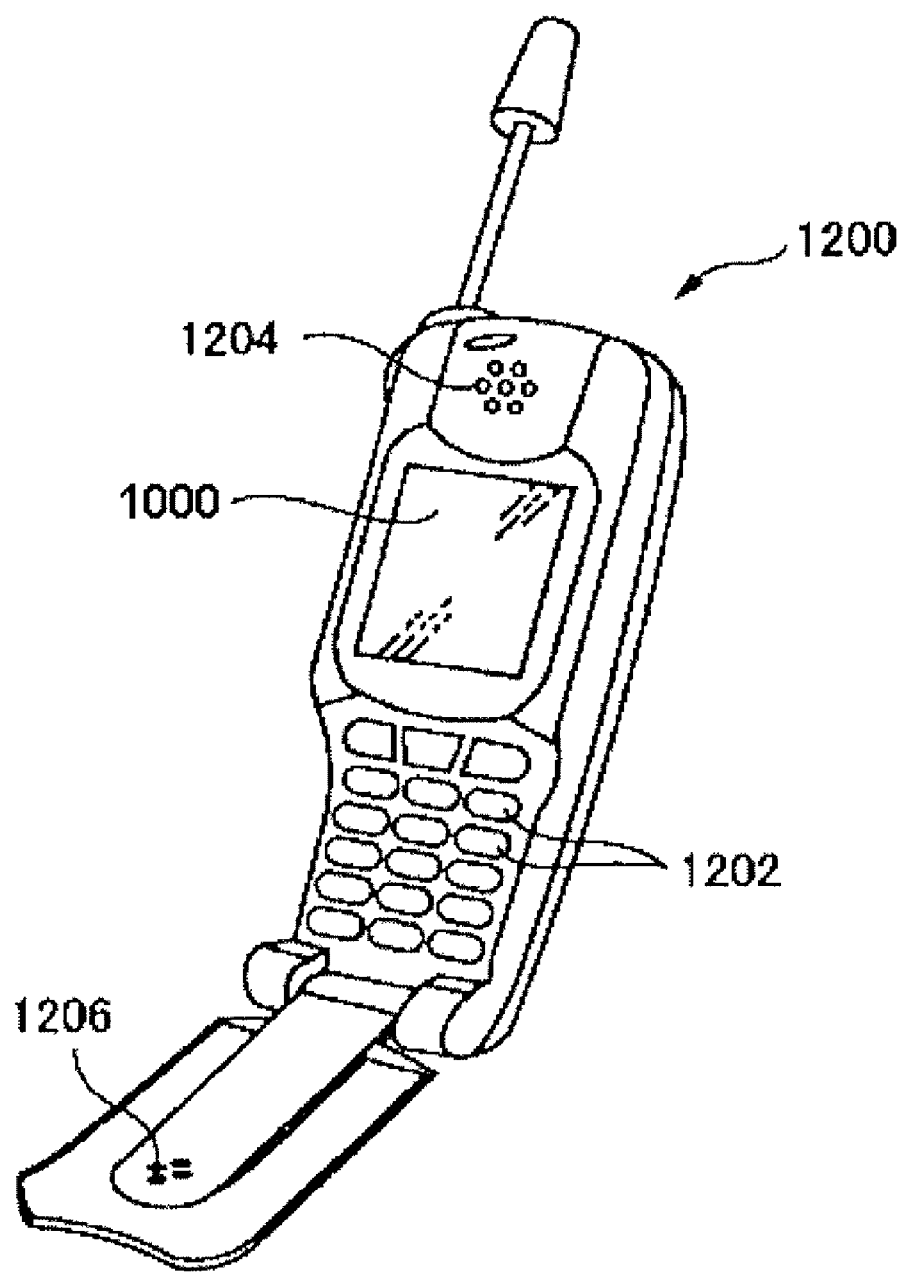
FIG. 12 is a perspective view which shows a structure of a portable phone (including a personal handy phone system) to which an electronic apparatus of the present invention is applied.

FIG. 12 is a perspective view which shows a structure of a portable phone (including a personal handy phone system) 1200 to which an electronic apparatus of the present invention is applied. Referring to FIG. 12, the portable phone 1200 is provided with a plurality of buttons 1202, an earpiece 1204, a mouthpiece 1206, and a display portion. The display portion is constituted from the image display apparatus 1000 described above.

Figure 13:
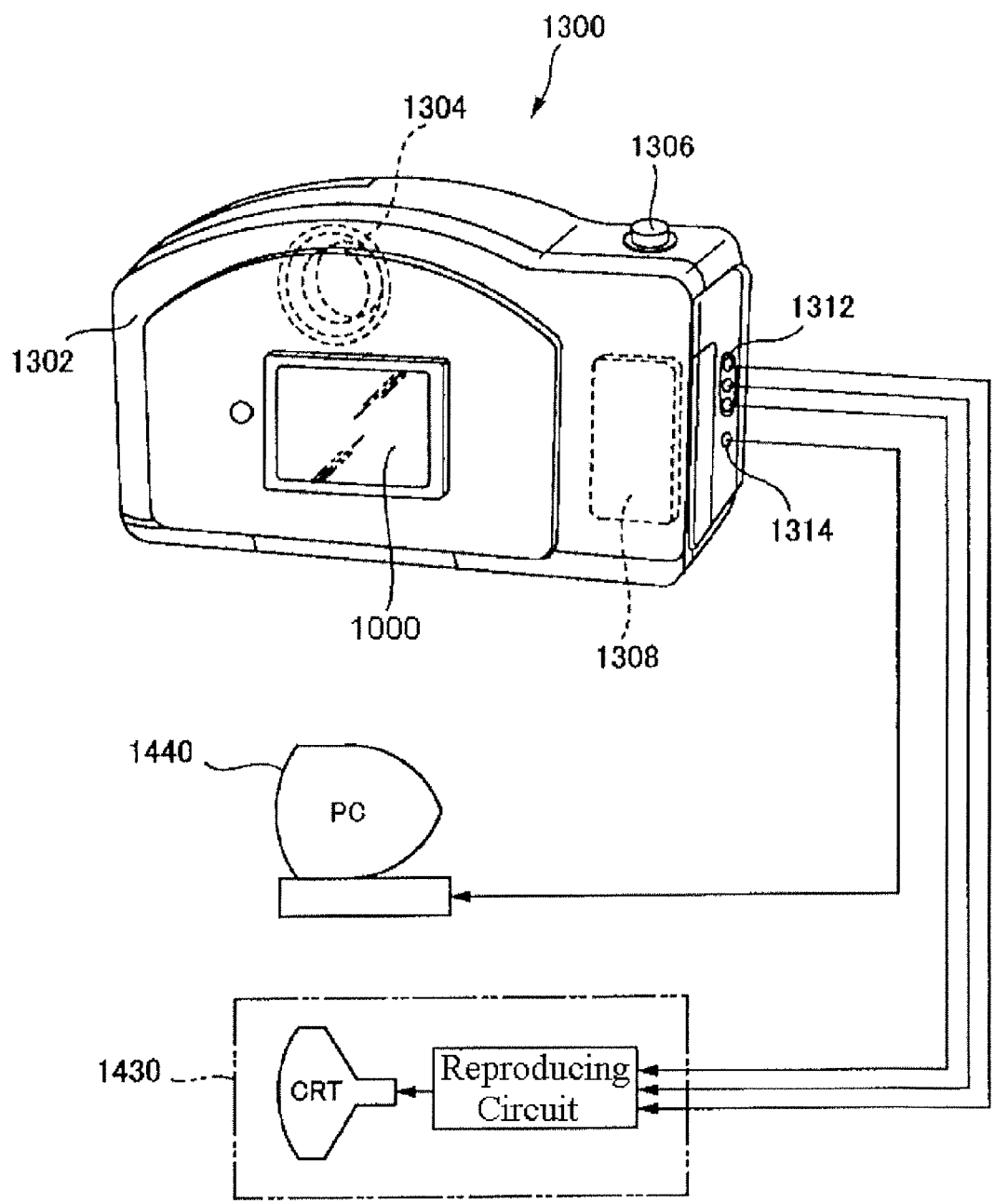
FIG. 13 is a perspective view which shows a structure of a digital still camera to which an electronic apparatus of the present invention is applied.

FIG. 13 is a perspective view which shows a structure of a digital still camera 1300 to which an electronic apparatus of the present invention is applied. In this drawing, connection of the digital still camera to external equipments thereof is schematically shown. A normal camera exposes a silver salt photographic film on the basis of an optical image of a subject, while the digital still camera 1300 generates an imaging signal (image signal) by photoelectrically converting an optical image of a subject into the imaging signal with imaging device such as a charge coupled device (CCD).

The image display apparatus 1000 described above is provided as a display portion on the back surface of a case (body) 1302 in the digital still camera 1300. The image display apparatus 1000 displays an image in response to an imaging signal outputted by the CCD, and serves as a finder for displaying the subject as an electronic image. A circuit board 1308 is placed inside the case 1302. A memory capable of storing such an imaging signal is placed on the circuit board 1308.

Further, a light receiving unit 1304 including an optical lens (imaging optical system), the CCD and the like is provided in the front surface side of the case 1302. When a photographer confirms an image of a subject displayed on the display portion (that is, the image display apparatus 1000), and pushes a shutter button 1306, an imaging signal of the CCD at the time is transferred to the memory of the circuit board 1308 and stored in this memory.

Further, a video signal output terminal 1312 and an input/output terminal 1314 for data communication are provided on the side surface of the case 1302 in the digital still camera 1300. As shown in FIG. 13, a television monitor 1430 and a personal computer 1440 are respectively connected to the video signal output terminal 1312 and the input/output terminal 1314 for data communication if needed. Moreover, the imaging signal stored in the memory of the circuit board 1308 is outputted to the television monitor 1430 or the personal computer 1440 by means of a predetermined operation.

In this regard, the electronic apparatus of the present invention can be suitably used in (or applied to), for example, televisions, video cameras, view finder type or monitor direct view type videotape recorders, laptop type personal computers, car navigation devices, pagers, electronic notebooks (including those having communication functions), electronic dictionaries, pocket calculators, electronic game devices, word processors, work stations, television telephones, television monitors for crime prevention, electronic binoculars, POS (point-of-sale) terminals, apparatuses with touch panel (for example, cash dispensers in a financial institutions, automatic ticket vending machines), medical devices (electronic thermometers, blood pressure meters, blood sugar meters, electrocardiogram displaying devices, ultrasound diagnostic devices, displays for endoscopes, for example), fish finders, various measurement devices, gauges (gauges for vehicles, airplanes, ships and the like, for example), flight simulators, any other types of monitors, projection type displays such as projectors and the like, in addition to the personal computer (mobile personal computer) 1100 shown in FIG. 19, the portable phone 1200 shown in FIG. 20 and the digital still camera 1300 shown in FIG. 21.

The droplet ejection apparatus, the method of manufacturing a panel from a base, the image display apparatus and the electronic apparatus according to the present invention have been described based on the embodiment shown in the drawings, but it should be noted that the present invention is not limited to the embodiment. Respective portions of the head unit, the droplet ejection apparatus, and the electronic apparatus according to the present invention can be replaced with an arbitrary arrangement capable of functioning in the same manner. Further, any other arbitrary component may be added to the head unit, the droplet ejection apparatus, and the electronic apparatus according to the present invention.

What is claimed is:

1. A method of manufacturing a panel from a base using a droplet ejection apparatus for supplying some kinds of liquid materials each having a predetermined color, the apparatus comprising:

a head unit having at least first and second groups corresponding to the liquid materials of the predetermined color, respectively, wherein the first group includes a plurality of droplet ejection heads comprising at least a first droplet ejection head, a second droplet ejection head, a third droplet ejection head and a fourth droplet ejection head for ejecting the liquid material of the predetermined color, each of the first to fourth droplet ejection heads including at least one nozzle array constituted from a plurality of nozzles linearly aligned, the nozzle arrays of the first to fourth droplet ejection heads being parallel to each other in a first direction parallel to each of the nozzle arrays, wherein the second droplet ejection head is arranged between the third droplet ejection head and the fourth droplet ejection head when viewed from the first direction, and the third droplet ejection head is arranged between the first droplet ejection head and the second droplet ejection head when viewed from the first direction, wherein the second group includes a plurality of droplet ejection heads comprising at least a fifth droplet ejection head, a sixth droplet ejection head, a seventh droplet ejection head and an eighth droplet ejection head for ejecting the liquid material of the predetermined color, each of the fifth to eighth droplet ejection heads including at least one nozzle array constituted from a plurality of nozzles linearly aligned, the nozzle arrays of the fifth to eighth droplet ejection heads being parallel to each other in the first direction parallel to each of the nozzle arrays, wherein the sixth droplet ejection head is arranged between the seventh droplet ejection head and the eighth droplet ejection head when viewed from the first direction, and the seventh droplet ejection head is arranged between the fifth droplet ejection head and the sixth droplet ejection head when viewed from the first direction;

a stage for supporting the base;

a moving mechanism for moving the stage with respect to the head unit; and a control unit configured to control operation of the head unit and the moving mechanism so that the plurality of droplet ejection heads of the first group of the head unit eject droplets of the liquid material of the predetermined color onto the base, and the plurality of droplet ejection heads of the second group of the head unit eject droplets of the liquid material of the predetermined color onto the base while moving the stage with respect to the head unit in a second direction perpendicular to the first direction, wherein an ejection area of the first group of the head unit in the first direction includes a first sub-area, a second sub-area, and a third sub-area with the second sub-area being continuously disposed between the first sub-area and the third sub-area without a gap, wherein an ejection area of the second group of the head unit in the first direction includes a fourth sub-area, a fifth sub-area, and a sixth sub-area with the fifth sub-area being continuously disposed between the fourth sub-area and the sixth sub-area without a gap, wherein, in the first group, the plurality of droplet ejection heads are arranged on the head unit so that the nozzle array of the first droplet ejection head overlaps the nozzle array of the third droplet ejection head throughout the first sub-area when viewed from the second direction, the nozzle array of the first droplet ejection head overlaps the nozzle array of the fourth droplet ejection head throughout the second sub-area when viewed from the second direction, and the nozzle array of the second droplet ejection head overlaps the nozzle array of the fourth droplet ejection head throughout the third sub-area when viewed from the second direction, wherein, in the second group, the plurality of droplet ejection heads are arranged on the head unit so that the nozzle array of the fifth droplet ejection head overlaps the nozzle array of the seventh droplet ejection head throughout the fourth sub-area when viewed from the second direction, the nozzle array of the fifth droplet ejection head overlaps the nozzle array of the eighth droplet ejection head throughout the fifth sub-area when viewed from the second direction, and the nozzle array of the sixth droplet ejection head overlaps the nozzle array of the eighth droplet ejection head throughout the sixth sub-area when viewed from the second direction, wherein the second sub-area and the fifth sub-area partially overlap each other when viewed from the second direction, and wherein the fourth droplet ejection head and the fifth droplet ejection head are disposed next to each other when viewed from the first direction, the method comprising:
preparing the base; and
supplying the some kinds of liquid materials of the predetermined color onto the base in the form of the droplets by ejecting the droplets by means of the droplet ejection apparatus while mutually moving the base with respect to the head unit in the second direction.

2. The method as claimed in claim 1, wherein the base is a base material for manufacturing a color filter substrate for a liquid-crystal display, and the some kinds of liquid materials are ink for forming a filter layer of the color filter substrate.

3. The method as claimed in claim 1, wherein the base is a base material for manufacturing an electroluminescence display, and the some kinds of liquid materials include a luminescent material for manufacturing the electroluminescence display.

4. The method as claimed in claim 1, wherein the predetermined color includes a first color and a second color, wherein the first to fourth droplet ejection heads eject the liquid material of the first color and the fifth to eighth droplet ejection heads eject the liquid material of the second color.

5. The method as claimed in claim 4, wherein the predetermined color further includes a third color, and the head unit further has a third group corresponding to the liquid material of the third color, wherein the third group includes a plurality of droplet ejection heads comprising at least a ninth droplet ejection head, a tenth droplet ejection head, an eleventh droplet ejection head and a twelfth droplet ejection head for ejecting the liquid material of the third color, each of the ninth to twelfth droplet ejection heads including at least one nozzle array constituted from a plurality of nozzles linearly aligned, the nozzle arrays of the ninth to twelfth droplet ejection heads being parallel to each other in the first direction parallel to each of the nozzle arrays, wherein the tenth droplet ejection head is arranged between the eleventh droplet ejection head and the twelfth droplet ejection head when viewed from the first direction, and the eleventh droplet ejection head is arranged between the ninth droplet ejection head and the tenth droplet ejection head when viewed from the first direction, wherein an ejection area of the third group of the head unit in the first direction includes a seventh sub-area, an eighth sub-area, and a ninth sub-area with the eighth sub-area being continuously disposed between the seventh sub-area and the ninth sub-area without a gap, wherein, in the third group, the plurality of droplet ejection heads are arranged on the head unit so that the nozzle array of the ninth droplet ejection head overlaps the nozzle array of the eleventh droplet ejection head throughout the seventh sub-area when viewed from the second direction, the nozzle array of the ninth droplet ejection head overlaps the nozzle array of the twelfth droplet ejection head throughout the eighth sub-area when viewed from the second direction, and the nozzle array of the tenth droplet ejection head overlaps the nozzle array of the twelfth droplet ejection head throughout the ninth sub-area when viewed from the second direction, wherein the second sub-area, the fifth sub-area and the eighth sub-area partially overlap each other when viewed from the second direction, and wherein the eighth droplet ejection head and the ninth droplet ejection head are disposed next to each other when viewed from the first direction.

6. The method as claimed in claim 1, wherein the preparing the base including:
forming black matrices on a supporting substrate;
applying a resist layer so as to cover the supporting substrate and the black matrices
exposing the resist layer by using a mask film formed in a matrix pattern provided on the resist layer to obtain non-exposed portions; and
removing the non-exposed portions of the resist layer by an etching process to obtain a plurality of banks to thereby obtain the base having the plurality of banks,
wherein the some kinds of liquid materials are supplied into the plurality of banks of the base in supplying the some kinds of liquid materials.

7. The method as claimed in claim 6 further comprising:
drying the some kinds of liquid materials supplied into the plurality of the banks of the base to obtain filter layers of the some kinds of liquid materials; and
forming a protective film on the supporting substrate so as to cover the filter layers and the plurality of banks to thereby obtain the panel.

* * * * *